United States Patent
Nam et al.

(10) Patent No.: US 9,735,699 B2
(45) Date of Patent: Aug. 15, 2017

(54) INTEGRAL INVERTER AND SOLAR CELL MODULE INCLUDING THE SAME

(71) Applicant: LG ELECTRONICS INC., Seoul (KR)

(72) Inventors: Hyukjin Nam, Seoul (KR); Joonho Jeon, Seoul (KR); Myonghwan Kim, Seoul (KR); Jinyoung Cho, Seoul (KR); Daehyun Shin, Seoul (KR); Byoungsu Yoon, Seoul (KR); Giyob Park, Seoul (KR); Byungwook Woo, Seoul (KR); Jungguen Kim, Seoul (KR); Hyunrok Mun, Seoul (KR)

(73) Assignee: LG Electronics Inc., Seoul (KR)

( * ) Notice: Subject to any disclaimer, the term of this patent is extended or adjusted under 35 U.S.C. 154(b) by 212 days.

(21) Appl. No.: 14/478,892

(22) Filed: Sep. 5, 2014

(65) Prior Publication Data

US 2015/0200603 A1 Jul. 16, 2015

(30) Foreign Application Priority Data

Jan. 15, 2014 (KR) .................. 10-2014-0005263
Jan. 27, 2014 (KR) .................. 10-2014-0009834

(51) Int. Cl.
*H02M 5/458* (2006.01)
*H05K 5/02* (2006.01)
*H05K 7/14* (2006.01)
*H01L 31/0443* (2014.01)
*H02S 40/32* (2014.01)
*H02S 40/34* (2014.01)

(52) U.S. Cl.
CPC .......... *H02M 5/4585* (2013.01); *H02S 40/32* (2014.12); *H02S 40/34* (2014.12); *H05K 5/0221* (2013.01); *H01L 31/0443* (2014.12)

(58) Field of Classification Search
CPC ...... H02M 5/4585; H02S 40/32; H02S 40/34; H05K 5/0221
See application file for complete search history.

(56) References Cited

U.S. PATENT DOCUMENTS 9,602,048 B2 *   3/2017  Kang .................. H02S 40/32
2010/0301991 A1 * 12/2010  Sella .................. G08B 13/1409
                                            340/3.1
2011/0083733 A1   4/2011  Marroquin et al.
(Continued)

FOREIGN PATENT DOCUMENTS

CN       202423320 U    9/2012
EP       2242113 A2    10/2010
(Continued)

*Primary Examiner* — Nguyen Tran
*Assistant Examiner* — Demetries A Gibson
(74) *Attorney, Agent, or Firm* — Birch, Stewart, Kolasch & Birch, LLP

(57) ABSTRACT

Discussed is an integral inverter usable with a solar cell module including a solar cell panel. The integral inverter includes a terminal connected to the solar cell panel, a bypass diode electrically connected to the terminal, an inverter member including a direct current (DC)-alternating current (AC) inverter electrically connected to the bypass diode and a case configured to integrate at least one of the terminal and the bypass diode with the DC-AC inverter located therein.

13 Claims, 15 Drawing Sheets

(56) References Cited

U.S. PATENT DOCUMENTS

| | | | | |
|---|---|---|---|---|
| 2012/0025617 A1* | 2/2012 | Mateicka | ............... | H01L 31/05 307/77 |
| 2012/0081934 A1* | 4/2012 | Garrity | ................. | H02M 7/46 363/37 |
| 2012/0126624 A1* | 5/2012 | Hester | ..................... | G05F 1/67 307/77 |
| 2012/0127770 A1 | 5/2012 | Kim | | |
| 2012/0262948 A1* | 10/2012 | Lee | ........................ | H02S 40/32 363/16 |
| 2012/0262949 A1* | 10/2012 | Han | ...................... | H02J 3/385 363/16 |
| 2012/0274264 A1* | 11/2012 | Mun | ..................... | H01L 31/05 320/101 |
| 2012/0325288 A1* | 12/2012 | Jang | ..................... | H02J 3/385 136/251 |
| 2013/0193775 A1* | 8/2013 | Lee | ......................... | H02J 5/00 307/151 |
| 2014/0007926 A1* | 1/2014 | Korman | ................ | H01L 31/18 136/251 |
| 2014/0211513 A1* | 7/2014 | Sakita | .............. | H02M 3/33523 363/16 |
| 2015/0003021 A1* | 1/2015 | Chang | ................ | H05K 7/1432 361/728 |
| 2016/0006392 A1* | 1/2016 | Hoft | ....................... | H02S 50/10 361/78 |

FOREIGN PATENT DOCUMENTS

| | | |
|---|---|---|
| EP | 2 518 775 A2 | 10/2012 |
| EP | 2557602 A2 | 2/2013 |
| JP | 2010-177631 A | 8/2010 |
| JP | 2012-94817 A | 5/2012 |
| KR | 10-2011-0128534 A | 11/2011 |
| WO | WO 2014/204398 A1 | 12/2014 |

\* cited by examiner (a)

(b)

INTEGRAL INVERTER AND SOLAR CELL MODULE INCLUDING THE SAME

CROSS-REFERENCE TO RELATED APPLICATION

This application claims the priority benefit of Korean Patent Applications Nos. 10-2014-0005263, filed on Jan. 15, 2014 and 10-2014-0009834 filed on Jan. 27, 2014 in the Korean Intellectual Property Office, the disclosures of which are incorporated herein by reference.

BACKGROUND OF THE INVENTION

1. Field of the Invention

Embodiments of the invention relate to an integral inverter and a solar cell module including the same, and more particularly to an integral inverter having an improved structure and a solar cell module including the same.

2. Description of the Related Art

Recently, due to depletion of existing energy resources, such as oil and coal, interest in alternative sources of energy to replace the existing energy resources is increasing. Most of all, solar cells are popular next generation cells to convert sunlight into electrical energy.

A solar cell panel having solar cells is connected to a junction box and, in turn, the junction box is connected to a direct current (DC)-alternating current (AC) inverter via a direct current output cable protruding from the junction box. More specifically, the DC-AC inverter converts direct current voltage or direct current, transmitted via a positive output cable and a negative output cable protruding from the junction box, into alternating current voltage or alternating current. The alternating current voltage or alternating current, generated by the DC-AC inverter, is transmitted to another solar cell module via an AC output cable, or transmitted to a power grid or the like.

In this instance, since the junction box and the DC-AC inverter must be separately manufactured and installed (for example, separately manufactured and installed in different cases), an installation space and installation time are increased upon application thereof to a solar cell module. In addition, since it is necessary to position DC output cables (i.e. two output cables) between the junction box and the DC-AC inverter for connection therebetween, an additional installation space and installation time are needed. In particular, these output cables are bulky and heavy, thus causing difficulty in installation. For this reason, an installation process of the junction box and the DC-AC inverter has very low productivity. In addition, the two output cables interconnecting the junction box and the DC-AC inverter may be shaken or separated from the junction box and the DC-AC inverter during transportation and when in use, thus causing several problems, such as, for example, damage to the solar cell panel due to collision with the solar cell panel.

SUMMARY OF THE INVENTION

Therefore, the embodiments of the invention have been made in view of the above problems, and it is an object of the embodiment of the invention to provide an integral inverter which is capable of improving productivity of an assembly process of a solar cell module and improving structural stability of the solar cell module and a solar cell module including the same.

In accordance with one aspect of the embodiment of the invention, the above and other objects can be accomplished by the provision of an integral inverter usable with a solar cell module comprising a solar cell panel, the integral inverter including a terminal connected to the solar cell panel, a bypass diode electrically connected to the terminal, an inverter member including a direct current (DC)-alternating current (AC) inverter electrically connected to the bypass diode and a case configured to integrate at least one of the terminal and the bypass diode with the DC-AC inverter located therein.

In accordance with another aspect of the embodiment of the invention, there is provided a solar cell module including a solar cell panel including a solar cell and a ribbon extending from the solar cell and an integral inverter including a terminal connected to the ribbon, a bypass diode electrically connected to the terminal, an inverter member including a direct current (DC)-alternating current (AC) inverter electrically connected to the bypass diode and a case configured to integrate at least one of the terminal and the bypass diode with the DC-AC inverter located therein, wherein the case includes a first through-hole for connection of the ribbon and the terminal and a second through-hole for connection with the DC-AC inverter and an external element.

BRIEF DESCRIPTION OF THE DRAWINGS

The above and other objects, features and other advantages of the embodiment of the invention will be more clearly understood from the following detailed description taken in conjunction with the accompanying drawings, in which.

DETAILED DESCRIPTION OF THE EMBODIMENTS

Figure 1:
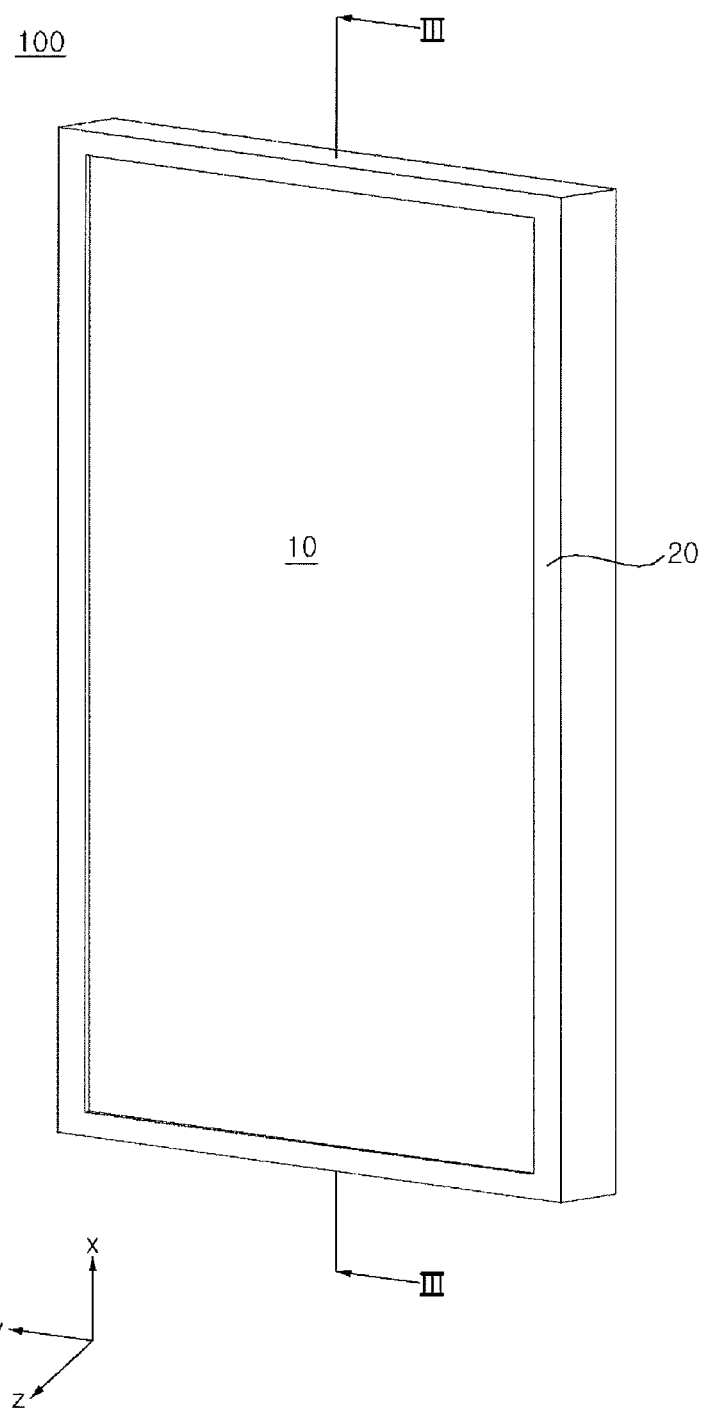
FIG. 1 is a front perspective view showing a solar cell module including an integral inverter according to an embodiment of the invention.

Reference will now be made in detail to the embodiments of the invention, examples of which are illustrated in the accompanying drawings. However, it will be understood that the invention should not be limited to the embodiments and may be modified in various ways.

In the drawings, to clearly and briefly explain the embodiments of the invention, illustration of elements having no connection with the description is omitted, and the same or extremely similar elements are designated by the same reference numerals throughout the specification. In addition, in the drawings, for more clear explanation, the dimensions of elements, such as thickness, width, and the like, are exaggerated or reduced, and thus the thickness, width, and the like of the embodiment of the invention are not limited to the illustration of the drawings.

In the entire specification, when an element is referred to as "including" another element, the element should not be understood as excluding other elements so long as there is no special conflicting description, and the element may include at least one other element. In addition, it will be understood that, when an element such as a layer, film, region or substrate is referred to as being "on" another element, it can be directly on the other element or intervening elements may also be present. On the other hand, when an element such as a layer, film, region or substrate is referred to as being "directly on" another element, this means that there are no intervening elements therebetween.

Hereinafter, an integral inverter and a solar cell module including the same according to embodiments of the invention will be described in detail with reference to the accompanying drawings.

Figure 2:
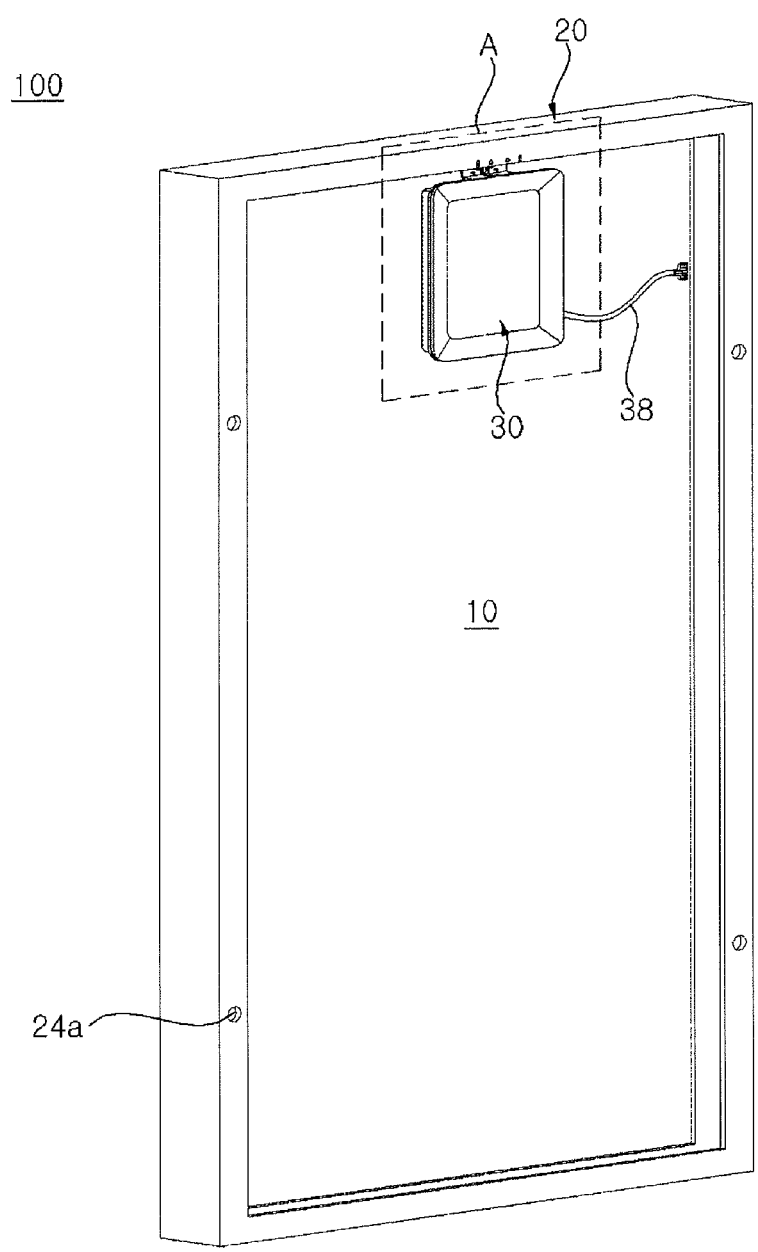
FIG. 2 is a rear perspective view showing the solar cell module of FIG. 1.

FIG. 1 is a front perspective view showing a solar cell module including an integral inverter according to an embodiment of the invention and FIG. 2 is a rear perspective view showing the solar cell module of FIG. 1. In addition, FIG. 3 is a sectional view taken along line III-III of FIG. 1.

Figure 3:
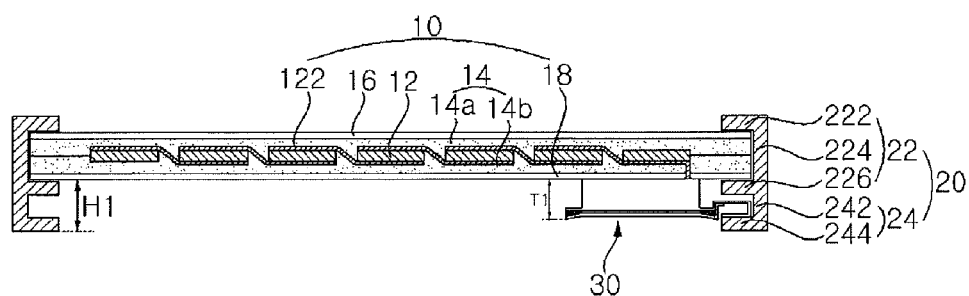
FIG. 3 is a sectional view taken along line of FIG. 1.
Figure 3:
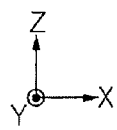

With reference to FIGS. 1 to 3, the solar cell module, designated by reference numeral 100, according to the embodiment of the invention includes a solar cell panel 10 having solar cells 12 and an integral inverter 30 mounted on and connected to the solar cell panel 10. The solar cell module 100 may further include a frame 20 configured to fix an outer rim portion of the solar cell panel 10. A sealing member may be located between the solar cell panel 10 and the frame 20 to hermetically seal and attach the solar cell panel 10 and the frame 20 to each other. This will be described below in more detail.

The solar cell panel 10 includes one or more solar cells 12. In addition, the solar cell panel 10 may include a sealing layer 14 surrounding the solar cells 12 to hermetically seal the same, a front substrate 16 disposed on one surface of the sealing layer 14 at the front of the solar cells 12 and a back substrate 18 disposed on the other surface of the sealing layer 14 at the back of the solar cells 12.

In one example, the solar cell panel 10 may include the solar cells 12, a semiconductor substrate (for example, a single crystal semiconductor substrate, more particularly, a single crystal silicon wafer), first and second conductive areas formed on or above the semiconductor substrate, the first and second conductive areas having opposite conductivities, and first and second electrodes connected respectively to the first and second conductive areas. Here, the semiconductor substrate may have a low-density p-type or n-type dopant, and one of the first and second conductive areas may have a p-type dopant and the other conductive area may have an n-type dopant. In addition, the first or second conductive area may be a doping area formed by doping a portion of the semiconductor substrate with a dopant and may be a semiconductor layer separately formed above the semiconductor substrate and doped with a dopant. In addition, the solar cells 12 may be arranged in a line to form a solar cell string in such a way that the first electrode of one solar cell 12 is connected to the second electrode of another neighboring solar cell 12 by a ribbon 122 or the like. Various other known structures may be applied to a structure of the solar cells 12, a connection structure of the solar cells 12 and the like.

As described above, the embodiment of the invention exemplifies that the solar cells 12 are single crystal silicon semiconductor solar cells. However, the embodiment of the invention is not limited thereto and the solar cells 12 may be selected from among various other structures of solar cells, such as thin film solar cells, fuel sensitive solar cells, tandem solar cells, composite semiconductor solar cells and the like. In addition, although the embodiment of the invention exemplifies provision of the solar cells 12, a single solar cell 12 may be provided.

The sealing layer 14 may include a first sealing layer 14a located between the solar cells 12 and the front substrate 16 and a second sealing layer 14b located between the solar cells 12 and the back substrate 18, the first sealing layer 14a and the second sealing layer 14b being bonded to each other. The sealing layer 14 surrounds and hermetically seals the solar cells 12, thereby blocking moisture or oxygen that may have a negative effect on the solar cells 12. In addition, constituent components of the solar cell module 100 (i.e. the front substrate 16, the solar cells 12 and the back substrate 18) are chemically coupled to one another. Through implementation of a lamination process of stacking the back substrate 18, the second sealing layer 14b, the solar cells 12 or the solar cell string, the first sealing layer 14a and the front substrate 16 one above another in this sequence and, thereafter, bonding the same to one another by applying heat and/or pressure thereto, all of the aforementioned constituent components may be integrated with one another.

The first sealing layer 14a and the second sealing layer 14b may be formed of ethylene vinyl acetate (EVA) copolymer resin, polyvinyl butyral, silicone resin, ester-based resin, olefin-based resin or the like. In this instance, the first sealing layer 14a and the second sealing layer 14b may be formed of the same material, or may be formed of different materials. However, the embodiment of the invention is not limited thereto. Thus, the first and second sealing layers 14a and 14b may be formed of one or more of various other materials via various other methods rather than the aforementioned lamination process.

The front substrate 16 is disposed on the first sealing layer 14a to form a front surface of the solar cell panel 10. The front substrate 16 may be formed of a material that has sufficient strength to protect the solar cells 12 from external shock and the like and light transmittance to transmit light such as sunlight and the like. In one example, the front substrate 16 may be a glass substrate. In this instance, the front substrate 16 may be a tempered glass substrate to achieve enhanced strength, and various other alterations in which the front substrate 16 additionally comprises various other materials to achieve various enhanced properties are possible. Alternatively, the front substrate 16 may be a sheet or film formed of a resin or the like. That is, the embodiment of the invention is not limited to these constituent materials of the front substrate 16 and the front substrate 16 may be formed of various other materials.

The back substrate 18 is a protective layer disposed on the second sealing layer 14b to protect the solar cells 12 at the back of the solar cells 12. The back substrate 18 may have waterproofing, electrical insulation and anti-ultraviolet functions.

The back substrate 18 may have sufficient strength to protect the solar cells 12 from external shock and the like and may function to transmit or reflect light based on a desired structure of the solar cell panel 10. In one example, in a structure for introduction of light through the back substrate 18, the back substrate 18 may be formed of a light transmitting material. In a structure for reflection of light from the back substrate 18, the back substrate 18 may be formed of a material not transmitting or reflecting light. In one example, the back substrate 18 may take the form of a substrate such as glass, or may take the form of a film or sheet. For example, the back substrate 18 may be a Tedlar/PET/Tedlar (TPT) substrate, or may be formed of a polyvinylidene fluoride (PVDF) resin formed on at least one surface of polyethyleneterephthlate (PET). Poly vinylidene fluoride is a polymer having a structure of $(CH_2CF_2)n$ and has double fluorine bonds, thus exhibiting excellent mechanical properties, weather-resistance and ultraviolet-resistance. The embodiment of the invention is not limited to these constituent materials of the back substrate 18.

To stably fix the solar cell panel 10 having the above-described layers, the outer rim portion of the solar cell panel 10 may be fixed to the frame 20. Although the drawing shows the entire outer rim portion of the solar cell panel 10 as being fixed to the frame 20, the embodiment of the invention is not limited thereto. Thus, various other alterations, such as, for example, an alteration in which only a partial edge of the solar cell panel 10 is fixed to the frame 20, are possible.

In the embodiment of the invention, the frame 20 may include a panel inserting part 22 into which at least a portion of the solar cell panel 10 is inserted, and an extension part 24 extending outward from the panel inserting part 22.

More specifically, the panel inserting part 22 may be comprised of a front portion 222 located at a front surface of the solar cell panel 10, a lateral portion 224 located at a lateral surface of the solar cell panel 10, and a back portion 226 located at a back surface of the solar cell panel 10. These portions 222, 224 and 226 of the panel inserting part 22 may be connected to one another to define a space into which the outer rim portion of the solar cell panel 10 is inserted. In one example, the panel inserting part 22 may be bent two times to have a "U"-shaped or "⊏"-shaped cross section such that an edge of the solar cell panel 10 is located inside the panel inserting part 22. However, the embodiment of the invention is not limited thereto, and any one of the front portion 222, the lateral portion 224 and the back portion 226 may be omitted or each portion may be partially removed. Various other alterations are also possible.

The extension part 24, extending rearward from the panel inserting part 22, may be comprised of a first portion 242 extending rearward from the panel inserting part 22, the first portion 242 being parallel to the lateral portion 224 (or being formed in the same plane as the lateral portion 224), and a second portion 244 bent from the first portion 242, the second portion 244 being spaced from the back surface of the solar cell panel 10 or the back portion 226 by a constant distance. The second portion 244 may be parallel to or tilted from the back surface of the solar cell panel 10 or the back portion 226. As such, the extension part 24 may be bent one time to have an "L"-shaped or "∟"-shaped cross section such that a space is defined between the extension part 24 and the back portion 226.

The extension part 24 serves to enhance the strength of the frame 20 and is configured to be fixed to a stand, a support body, a floor or the like. The extension part 24 may have holes 24a through which fastening members, which will be fastened to the stand, the support body or the floor, are fastened. As the fastening members or the like are fastened through the second portion 244 spaced from the solar cell panel 10, it is possible to prevent damage to the solar cell panel 10 upon installation of the solar cell module 100 using the fastening members.

To stably fix the fastening members or the like, the second portion 244 may have an area equal to or greater than an area of the back portion 226 (i.e. may have a width equal to or greater than a width of the back portion 226). In addition, various known structures of fastening members may be used. The embodiment of the invention is not limited thereto, and the extension part 24 may have various other shapes rather than the above-described shape.

The frame 20 may be fixed to the solar cell panel via various methods. In one example, the outer rim portion of the solar cell panel 10 may be an elastic portion (for example, an elastic tape), and the solar cell panel 10 may be inserted into the panel inserting part 22 of the frame 20 using the elastic portion thereof. However, the embodiment of the invention is not limited thereto, and various other alterations, such as, for example, an alteration in which constituent parts of the frame 20 are assembled and coupled to one another around the solar cell panel 10, are possible.

In addition, in the embodiment of the invention, the integral inverter 30 may be connected to the solar cells 12 of the solar cell panel 10. In one example, the integral inverter 30 may be disposed on the back surface of the solar cell panel 10 and located close to an upper end portion of the solar cell panel 10. In this instance, a thickness T1 of the integral inverter 30 may be equal to or less than a height H1 of the extension part 24 of the frame 20 (more particularly, a height of the first portion 242). Here, the height H1 of the extension part 24 may be defined as a distance from the back surface of the solar cell panel 10 to an outer surface of the second portion 244 of the extension part 24. As such, the integral inverter 30 may have a thickness required to prevent the integral inverter 30 from protruding from the outer surface of the second portion 244. That is, a back surface of the integral inverter 30 (i.e. a surface opposite to the solar cell panel 10) may be located in the same plane as the outer surface of the second portion 244 or may be located closer to the solar cell panel 10 than the outer surface of the second portion 244. In addition, with regard to a portion of the integral inverter 30 located inside the extension part 24, a back surface (i.e. a surface opposite to the solar cell panel 10) of the corresponding portion may be located in the same plane as an inner surface of the second portion 244 or may be located closer to the solar cell panel 10 than the inner surface of the second portion 244, which may assist the integral inverter 30 in being easily positioned inside the extension part 24. In this way, it is possible to minimize a volume of the solar cell module 100 and to efficiently utilize a space at the back of the solar cell panel 10. In addition, in consideration of the instance in which a plurality of solar cell modules 100 is manufactured and then stacked one above another upon transportation and the like, it is possible to minimize collision shock between the solar cell modules 100. In the embodiment of the invention, the integral inverter 30 may be coupled to the extension part 24 of the frame 20 close to the upper end portion of the solar cell panel 10, and/or may be attached to the back surface of the solar cell panel 10. This will be described below in more detail.

The integral inverter 30 according to the embodiment of the invention is an integrated combination of at least a portion of a conventional junction box and at least a portion of a conventional inverter. Thus, the integral inverter 300 may be called a junction box integrated inverter, a bypass diode integrated inverter, an integral junction box, an inverter integrated junction box and the like. The integral inverter 30 will be described below in more detail with reference to FIGS. 1 to 3 and FIGS. 4 to 9.

Figure 4:
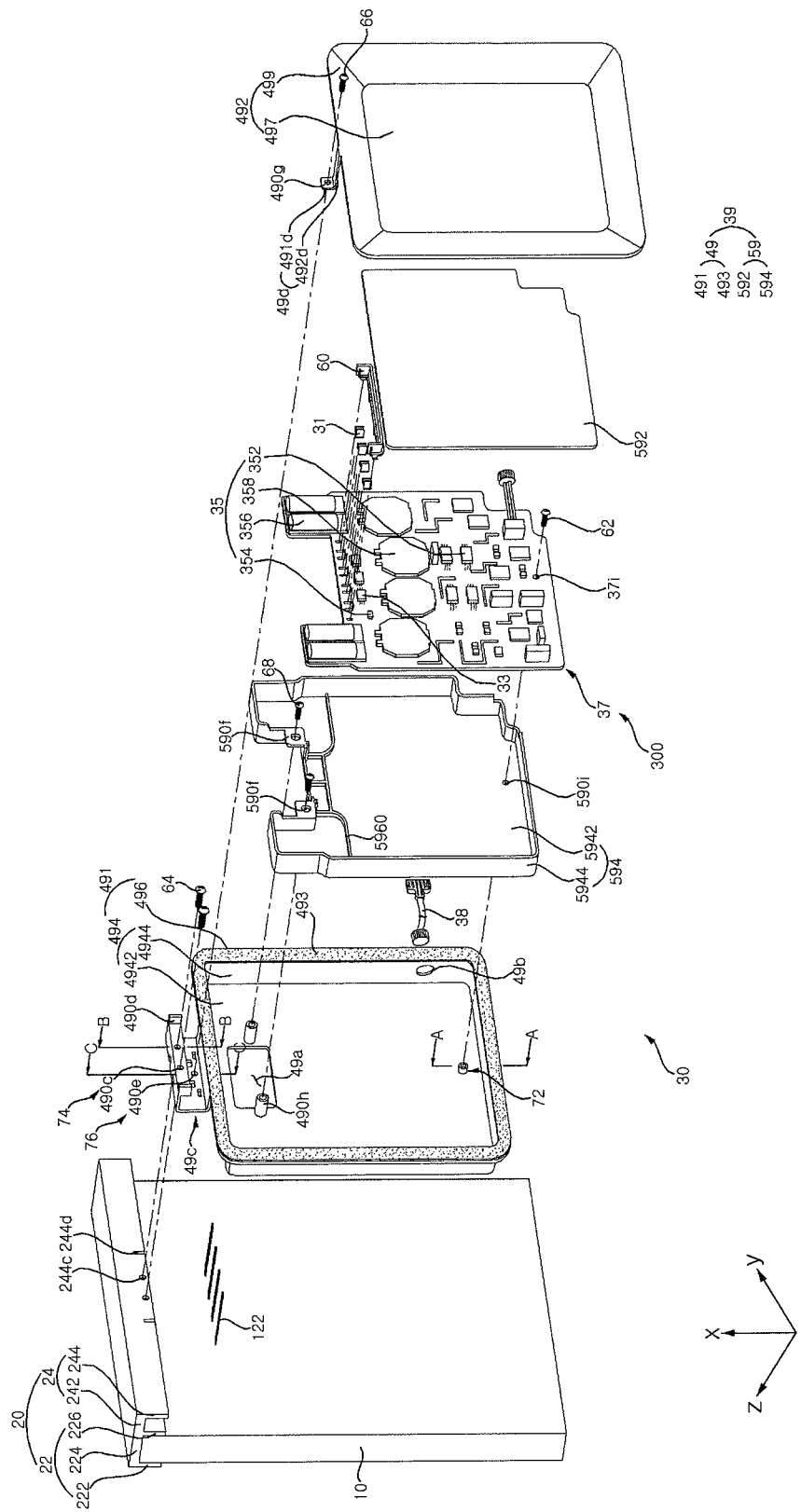
FIG. 4 is an enlarged exploded perspective view of portion A of FIG. 2.
Figure 5:
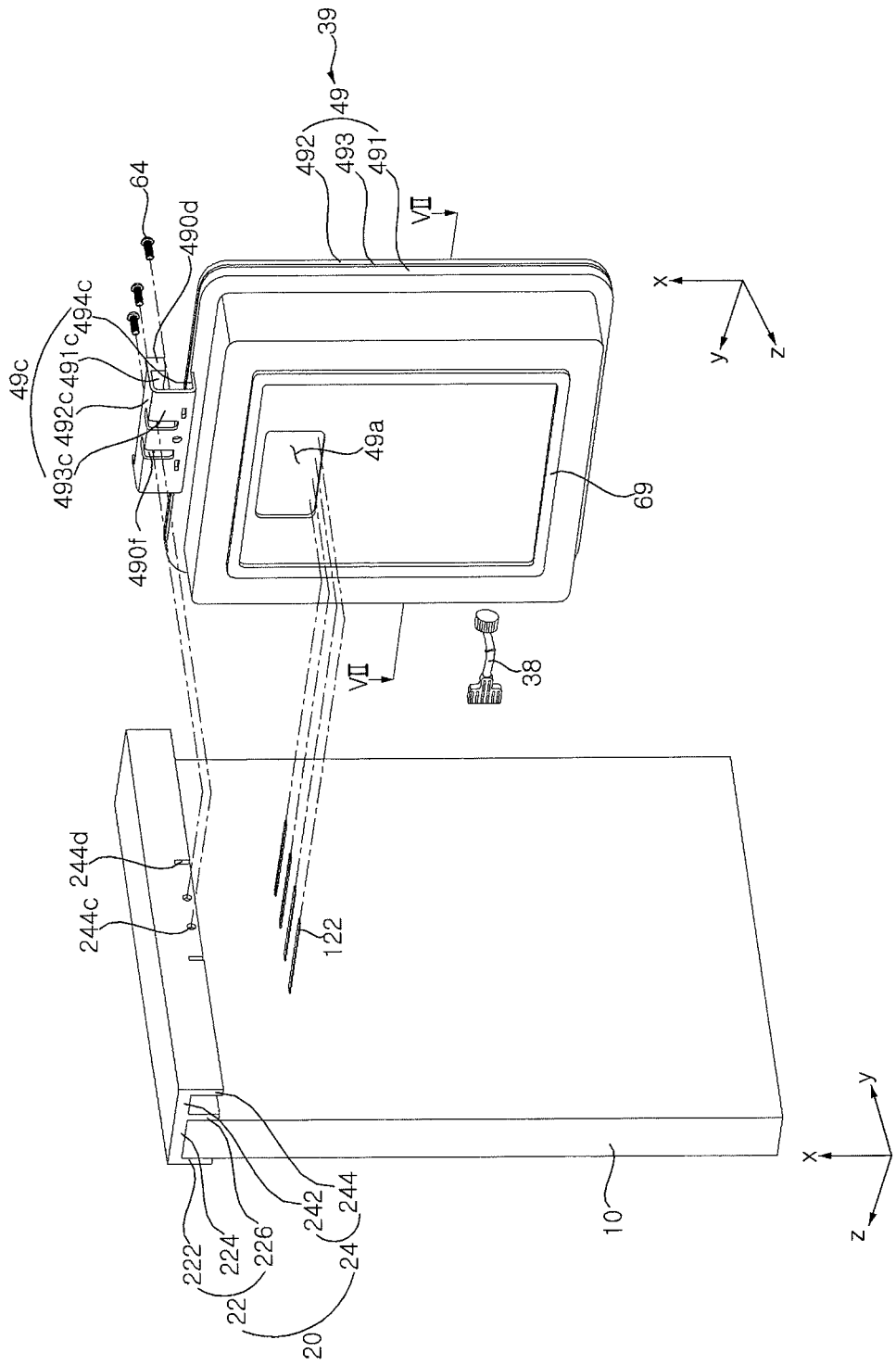
FIG. 5 is an enlarged exploded perspective view of portion A of FIG. 2 showing a surface of an integral inverter adjacent to a solar cell panel separated from the integral inverter.
Figure 6:
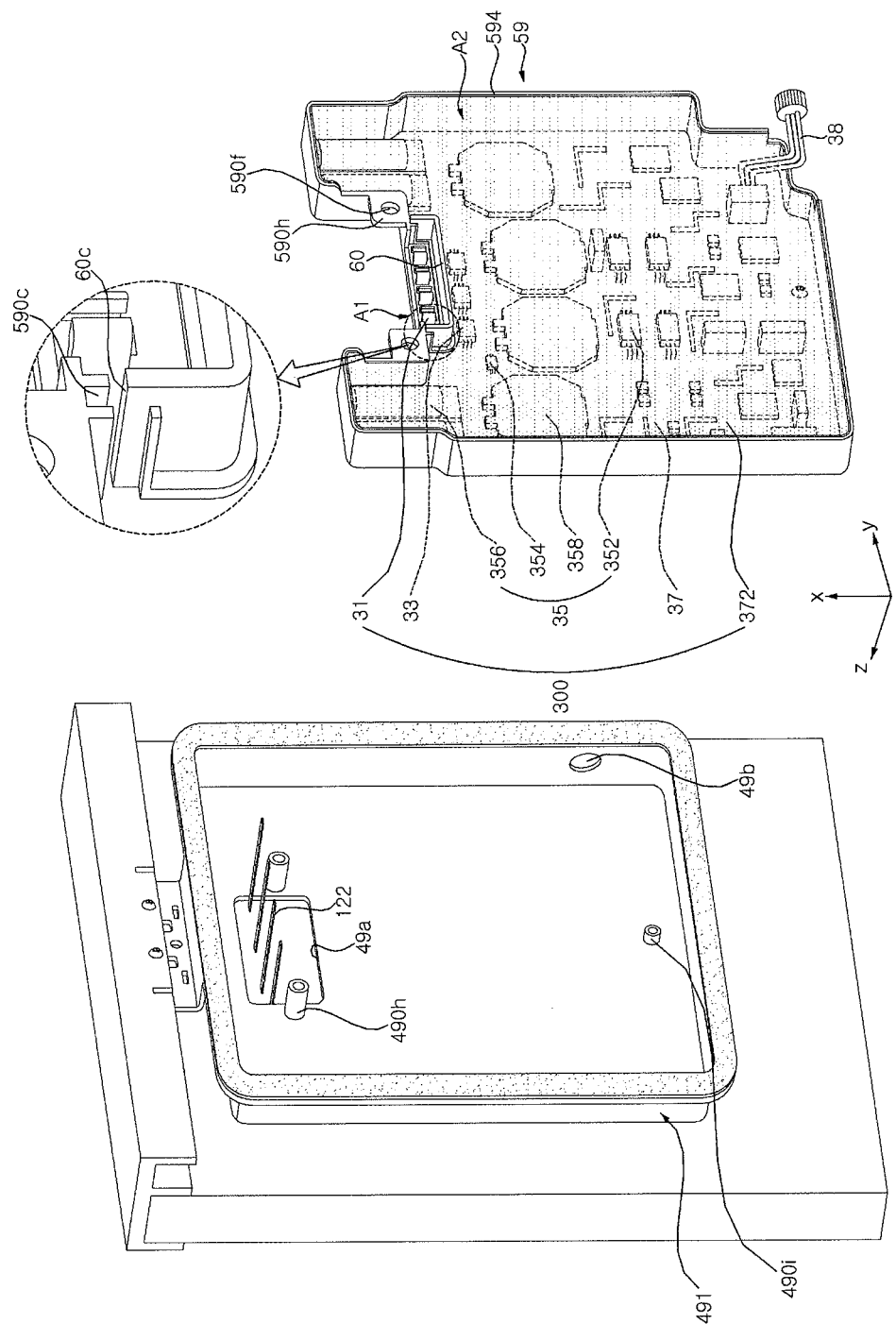
FIG. 6 is a perspective view showing some parts of the integral inverter shown in FIG. 1.

FIG. 4 is an enlarged exploded perspective view of portion A of FIG. 2, and FIG. 5 is an enlarged exploded perspective view of portion A of FIG. 2 showing a surface of the integral inverter 30 adjacent to the solar cell panel 10 separated from the integral inverter 30. FIG. 6 is a perspective view showing some parts of the integral inverter 30 shown in FIG. 1. For brief and clear illustration, a potting member 372 is omitted from FIG. 4. The potting member 372 will be described below in detail with reference to FIG. 6.

With reference to FIGS. 4 and 5, the integral inverter 30 according to the embodiment of the invention is formed by integrating terminals 31 connected to the solar cells (see reference numeral 12 in FIG. 3) (or the solar cell panel 10) and/or bypass diodes 33 electrically connected to the terminals 31, and an inverter member 35 electrically connected to the bypass diodes 33 and having DC-AC inverters 352 with one another. In this instance, the terminals 31 may be connected to ribbons 122 extending from the solar cells 12. In the embodiment of the invention, a case 39 (more specifically, a first case 49) includes a conductive material layer (see reference numeral 47 of FIGS. 12A to 12C) and, thus, the first case has a grounding function. More specifically, the integral inverter 30 according to the embodiment of the invention may include a first ground structure 72 configured to ground the first case 49 and the circuit board 37 and a second ground structure 74 configured to ground the first case 49 and the frame 20. Assuming that the first case 49 includes a first case part 491 and a second case part 492 coupled to each other, the integral inverter 30 may further include a third ground structure 76 configured to ground the first case part 491 and the second case part 492. In one example, the first to third ground structures 72, 74 and 76 may be acquired via fastening of first to third fastening members 62, 64 and 66. After description of formation of the entire integral inverter 3, the first to third ground structures 72, 74 and 76 will be described below in more detail with reference to FIGS. 12A to 12C and FIGS. 13A to 13D.

In the embodiment of the invention, the terminals 31 and/or the bypass diodes 33 and the inverter member 35 are integrated with one another.

Here, integration may include all states in which two or more components are recognized as any one element, article, object or member when fixed to the solar cell panel 10 and/or the frame 20 during or after installation. For example, integration may mean that two or more components are located in the same case and integrated by the same case, may mean that two or more components are fixed to the same member by fitting or attachment and integrated by the same member, may mean that two or more components are formed together at the same member to constitute a portion of the same member, and may mean that two or more components are surrounded by or fixed to the same member. On the other hand, when two or more components are connected to one another via additional output cables or the like, this may be difficult to be considered as integration. In this instance, the terminals 31, the bypass diodes 33 and the inverter member 35 may be inseparably integrated with one another, or may be separably integrated with one another to enable easy separation upon repair and replacement.

In the integral inverter 30 according to the embodiment of the invention, the terminals 31, the bypass diodes 33 and the inverter member 35 are formed on a circuit board 37 having a circuit pattern (or wirings). As such, it can be said that the terminals 31, the bypass diodes 33 and the inverter member 35 are integrated with one another by the circuit board 37. In addition, as shown by example in FIG. 6, the potting member 372 may be located to cover or surround the circuit board 37. As such, it can be said that the bypass diodes 33 and the inverter member 35 are integrated with each other by the potting member 372. In addition, the circuit board 37 on which the terminals 31, the bypass diodes 33 and the inverter member 35 are formed may be accommodated in the same case 39. As such, it can be said that the terminals 31, the bypass diodes 33 and the inverter member 35 are integrated with one another by the same case 39.

The embodiment of the invention exemplifies that the terminals 31, the bypass diodes 33 and the inverter member 35 are integrated with one another by the same circuit board 37, the same potting member 372 and the same case 39. More specifically, as the terminals 31, the bypass diodes 33 and the inverter member 35 are arranged on the same circuit board 37 and the potting member 372 covers the bypass diodes 33, the inverter member 35 and the circuit board 37, the terminals 31, the bypass diodes 33, the inverter member 35, the circuit board 37 and the potting member 372 are integrated with one another to configure a circuit board unit 300. The circuit board unit 300 may be fixed in the case 39. This may allow the terminals 31, the bypass diodes 33 and the inverter member 35 to be more firmly integrated with one another. However, the embodiment of the invention is not limited thereto and the aforementioned components may be integrated with one another in a simplified structure using at least one of various integration methods. In addition, although the embodiment of the invention exemplifies that the terminals 31, the bypass diodes 33 and the inverter member 35 are integrated with one another, the embodiment of the invention is not limited thereto. Thus, only the bypass diodes 33 and the inverter member 35 may be integrated with each other and various other alterations are also possible.

In the embodiment of the invention, the case 39 may have various structures and shapes to provide a space in which the terminals 31, the bypass diodes 33 and the inverter member 35, integrated with one another, are accommodated and to allow the solar cell panel 10 and/or the frame 20 to be stably fixed thereto.

In one example, in the embodiment of the invention, the case 39 may include a first case 49 forming an external shape or external surface of the case 39, the first case 49 being fixed to the solar cell panel 10 and/or the frame 20, and a second case 59 located inside the first case 49, the second case 59 receiving the circuit board unit 300 therein. In this instance, the second case 59 is separably coupled to the first case 49 to allow the circuit board unit 300 received in the second case 59 to be easily fixed to the first case 49 or to be easily separated from the first case 49. This will be described below in more detail.

Figure 7:
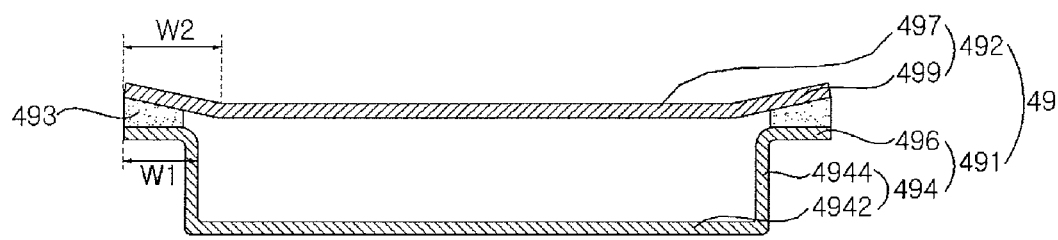
FIG. 7 is a sectional view taken along line VII-VII of FIG. 5 showing different examples in (a) and (b)
Figure 7:
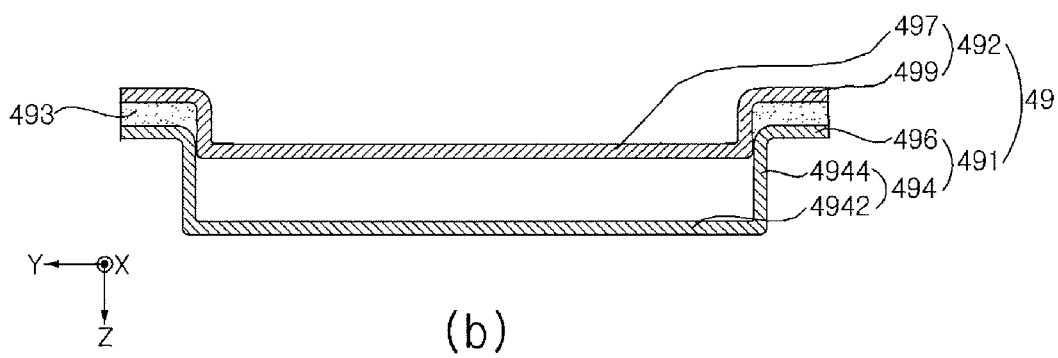

The first case 49 will be described below in more detail with reference to FIG. 7 as well as FIGS. 4 and 5. FIG. 7 is a sectional view taken along line VII-VII of FIG. 5 showing different examples in (a) and (b).

In the embodiment of the invention, the first case 49 is comprised of a first case part 491 and a second case part 492 bonded to each other to form an integral case. As such, in a state in which the first case part 491 and the second case part 492 are separated from each other, insertion or removal of the circuit board unit 300 and/or the second case 59 into or from the first case 49 may be easily performed. Also, in a state in which the first case part 491 and the second case part 492 are coupled to each other, the circuit board unit 300 and the second case 59 may be stably received in the first case 49.

Here, the first case part 491 may include an inner space portion 494 defining an inner space by a bottom surface 4942 and lateral surfaces 4944 thereof, and bonding flanges 496 extending from an upper end of the inner space portion 494, the bonding flanges 496 being parallel to or inclined relative to the bottom surface 4942. In this instance, the lateral surfaces 4944 may be formed at all edges of the bottom surface 4942 such that the inner space defined in the inner space portion 494 has only one open face. For example, when the bottom surface 4942 has a rectangular shape, four lateral surfaces 4944 may extend respectively from four edges of the rectangular bottom surface 4942 to define a rectangular parallelepiped having one open face. In one example, the inner space portion 494 may have at least five faces such that only one face is open.

In the drawing, the bottom surface 4942 may have four straight lines and be rounded at corners thereof where two neighboring straight lines meet. For example, the bottom surface 4942 may have an approximately rectangular shape and be rounded at four corners thereof. The lateral surfaces 4944 may be formed at all of the edges of the bottom surface 4942 and extend to cross the bottom surface 4942 (for example, in a direction perpendicular to the bottom surface 4942). As such, the lateral surfaces 4944 may include four planes corresponding to the four straight lines and four rounded surfaces located respectively between two neighboring planes. This shape may provide a sufficient inner space and prevent a user from being injured by sharp corners. However, the embodiment of the invention is not limited thereto and shapes and the like of the bottom surface 4942 and the lateral surfaces 4944 may be altered in various ways.

The bonding flanges 496 may be bent from the lateral surfaces 4944 so as to extend outward. The bonding flanges 496 provide a region to which a bonding member 493 is applied, thus assisting the first case part 491 and the second case part 492 in being bonded to each other by the bonding member 493. In this instance, the bonding flanges 496, which are bent from the lateral surfaces 4944 so as to extend outward, open the entire inner space of the inner space portion 494, which may allow the terminals 31, the bypass diodes 33 and the inverter member 35 to be easily inserted into or removed from the first case 49 without a risk of being caught by the bonding flanges 496. The bonding flanges 496 may include flat surfaces parallel to the bottom surface 4942, or flat surfaces perpendicular to the lateral surfaces 4944. Hence, the bonding member 493 may be stably applied to the bonding flanges 496. However, the embodiment of the invention is not limited thereto.

In the embodiment of the invention, when viewing the bonding flanges 496 extending from ends of the lateral surfaces 4944 in plan, the bonding flanges 496 are successively formed to close the inner space defined by the inner space portion 494. Here, the bonding flanges 496 may include flat surfaces so as to be located in the same plane. Hence, the first case part 491 and the second case part 492 may be wholly bonded to each other by the bonding member 493 applied to the bonding flanges 496, which may maintain high hermetic sealing efficiency of the interior of the first case 49. In this instance, the bonding flanges 496 may have a consistent width to ensure even application of the bonding member 493, thus allowing the first case part 491 and the second case part 492 to be stably bonded to each other. In addition, when repair, replacement or the like is needed, a cutting tool (for example, a knife or the like) may be introduced into a gap between the bonding flange 496 and the second case part 492 and moved along the bonding flanges 496 to cut the bonding member 493, which enables easy separation of the first case part 491 and the second case part 492. That is, the first case part 491 and the second case part 492 may be easily separated from each other by moving the cutting tool along the flat surfaces of the bonding flanges 496.

In the embodiment of the invention, the second case part 492 may take the form of a plate that covers the open face of the inner space portion 494 and has an edge profile matching outer edges of the bonding flanges 496.

In this instance, as shown by example in (a) of FIG. 7, the second case part 492 may include a flat inner portion 497 parallel to the bottom surface 4942 and an inclined outer portion 499 located at the outer side of the inner portion 497 to extend far away from the first case part 491. A portion of the outer portion 499 overlapping the corresponding bonding flange 496 is bonded to the bonding flange 496 by the bonding member 493.

As a result of forming the inclined outer portion 499, a boundary line (or a boundary portion) that is visible to the naked eye or detectable by equipment is formed between the inner portion 497 and the outer portion 499. Thus, positions of the first case part 491 and the second case part 492 may be roughly aligned by positioning the outer portion 499 over the bonding flange 496 or by positioning the outer portion 499 so as not to deviate from the bonding flange 496. In this instance, the inner portion 497 may have a smaller area than an area of the bottom surface 4942. For example, a width W2 of the outer portion 499 may be greater than a width W1 of the bonding flange 496. Hence, positions of the first case part 491 and the second case part 492 may be more easily roughly aligned by positioning the boundary line between the inner portion 497 and the outer portion 499 inside the bonding flange 496 (i.e. in the inner space). The boundary line between the inner portion 497 and the outer portion 499 or the inner or outer portion 497 or 499 may serve as a guide, alignment mark or the like.

In addition, as a result of the outer portion 499 being inclined away from the inner portion 497, as shown by example in (a) of FIG. 7, a distance between the bonding flange 496 and the outer portion 499 (i.e. a thickness of the bonding member 493 located between the bonding flange 496 and the outer portion 499) is slightly greater at an outer edge of the bonding flange 496 than at an inner edge of the bonding flange 496. Hence, since a distance between the first case part 491 and the second case part 492 is greater at the outer edge of the bonding flange 496, the cutting tool may be easily introduced into the gap between the bonding flange 4976 and the outer portion 499 to cut the bonding member 493 upon separation of the first case part 491 and the second case part 492.

However, the embodiment of the invention is not limited thereto and the inner portion 497 and the outer portion 499 may have various other shapes. For example, as shown by example in (b) of FIG. 7, the inner portion 497 and the outer portion 499 may be stepped from each other by bending. In this instance, the inner portion 497 may protrude from the outer portion 499 toward the first case part 491 and the outer portion 499 may be located farther from the first case part 491 than the inner portion 497. Hence, the inner portion 497 may be located inside the first case part 491 and the outer portion 499 may be seated on the corresponding bonding flange 496, which may improve fixing stability of the first case part 491 and the second case part 492.

In addition, the embodiment of the invention exemplifies that the second case part 492 includes the inner portion 497 and the outer portion 499. The embodiment of the invention is not limited thereto and the second case part 492 may include a first portion and a second portion having different shapes and formed of different materials and the like. As such, a boundary line between the first portion and the second portion or the first or second portion may serve as a guide, alignment mark or the like. Alternatively, one of the first and second portions may be used to fix the first and second case parts 491 and 492 to each other using the bonding member 493 applied thereto, thereby serving to improve fixing stability.

The bonding member 493, which is located between each bonding flange 496 of the first case part 491 and the outer portion 499 of the second case part 492, serves to bond and seal the first case part 491 and the second case part 492, thereby preventing introduction of impurities, contaminants and the like from the outside and improving sealing and waterproofing performance. The bonding member 493 may be formed of any one of various materials having bonding and/or sealing properties and, for example, may be a sealant.

Although the embodiment of the invention exemplifies that the first case part 491 and the second case part 492 are fixed to each other by the bonding member 493, the embodiment of the invention is not limited thereto. That is, the first case part 491 and the second case part 492 may be fixed to each other using an elastic member, such as an O-ring or rubbery material, a latch member having a latch coupling structure, a fastening member, such as a bolt, a screw and the like and various other fixing members. In this instance, to improve sealing performance, at least two of a bonding member, an elastic member, a latch member and a fastening member may be used together. For example, when using one of an elastic member, a latch member and a fastening member with a bonding member, both fixing stability and sealing stability may be maximized. Various other structures may also be applied.

However, the embodiment of the invention is not limited thereto and the first case 49 may be formed so as not to enclose the entire inner space. In addition, various alterations, such as, for example, in which the lateral surfaces of the first case part 491 are partially or wholly omitted and the second case part 492 is partially provided with lateral surfaces, are possible. In addition, the first case 49 may consist of three or more parts coupled to one another and various other alterations are also possible.

Through provision of both the first case part 491 and the second case part 492, easy insertion and removal of internal components are possible. In addition, through bonding of the first case part 491 and the second case part 492 using the bonding member 493, stable sealing of the interior is possible, which may prevent problems due to external moisture and the like and stably protect internal components and the like from external shock. However, the embodiment of the invention is not limited thereto and the first case 49 may include at least one of the first case part 491 and the second case part 492. Various alterations, such as, for example, an alteration in which the second case part 492 is not provided and the bonding flanges 496 of the first case part 491 come into close contact with the solar cell panel 10, thus causing the solar cell panel 10 to serve as the second case part 492, are possible.

The first case 49 may include a structure for connection with the solar cells 12, an external structure (for example, another solar cell module 100 or a power grid) or the like. That is, the first case 49 may have a first through-hole 49a through which the ribbons 122 for connection with the solar cells 12 pass, and a second through-hole 49b through which a single AC output cable 38 for transmission of alternating current voltage generated by the integral inverter 30 passes.

That is, the first through-hole 49a for connection with the solar cells 12 and the second through-hole 49b for the AC output cable 38 are formed in the same first case 49. This is because the terminals 31 and/or the bypass diodes 33 and the inverter member 35 are integrated with one another. In the related art, a first through-hole for connection with solar cells has been formed in a case of a junction box and a second through-hole for an AC output cable has been formed in a case of an inverter in which an inverter member is located. Thus, the first through-hole and the second through-hole cannot be formed in the same case. On the other hand, in the embodiment of the invention, a structure for connection with the solar cell panel 10 and the output cable 38 used to outwardly apply alternating current voltage may be integrated with each other by the circuit board 37.

In one example, the first through-hole 49a may be formed in a surface of the first case 49 adjacent to the solar cell panel 10 (i.e. the bottom surface 4942 of the first case part 491). As such, the ribbons 122, which extend from the solar cells 12 through holes formed in the second sealing layer 14b and the back substrate 18, may be connected to the terminals 31 by a shorter path. The first through-hole 49a may be a single hole through which the ribbons 122 (n ribbons 122) respectively corresponding to solar cell strings pass, or may include a plurality of holes spaced apart from one another to correspond to the respective ribbons 122. The drawing shows a structure in which the first case 49 has a single first through-hole 49a through which the ribbons 122 pass together, which may ensure easier processing of the first case part 491.

The second through-hole 49b may be formed at a position to ensure easy connection with an external circuit. In one example, in the embodiment of the invention, the second through-hole 49b is formed in the farthest lateral surface 4944 from the terminals 31 such that voltage applied from the solar cell panel 10 to the terminals 31 is discharged outward through the AC output cable 38 after sequentially passing through the bypass diodes 33 and the inverter member 35. This may provide efficient arrangement of the terminals 31, the bypass diodes 33 and the inverter member 35.

In the embodiment of the invention, the AC output cable 38 is an output cable of the integral inverter 30 in which the terminals 31 connected to the ribbons 122 and/or the bypass diodes 33 are arranged. Thus, the single AC output cable 38 may extend outward through the second through-hole 49b. Generally, the AC output cable 38 may have three conducting wires having 3-phase voltage (current). That is, one AC output cable 38 has three conducting wires. The three conducting wires of the single AC output cable 38 may be joined into one to pass through the single second through-hole 49b, which may result in a simplified structure. However, the embodiment of the invention is not limited thereto and various alterations, such as, for example, an alteration in which the three conducting wires are discharged respectively through different second through-holes 49b, are possible.

In the embodiment of the invention, an output cable of the integral inverter 30 in which the terminals 31 connected to the ribbons 122 and/or the bypass diodes 33 are arranged is the AC output cable 38 and there is no DC output cable. This is because the terminals 31 and/or the bypass diodes 33 and the inverter member 35 are integrated with one another. In the related art, since direct current voltage or direct current is discharged from a junction box in which terminals and bypass diodes are arranged, there are two DC output cables including a positive output cable and a negative output cable.

The first case 49 may further have a fastener 49c for coupling with the frame 20. The fastener 49c is a part that is coupled to the frame 20 via fastening members 62. In the embodiment of the invention, the fastener 49c may be integrally formed with the first case part 491 or the second case part 492 so as to extend therefrom. As such, the first case 49 having the fastener 49c may be formed by the same process, which may improve productivity.

The fastener 49c may extend from a portion of the first case 49 adjacent to the frame 20 (i.e. an upper end portion in the drawing) and come into contact with at least one surface of the frame 20 (more particularly, the second portion 244 of the frame 20). As the fastener 49c and the second portion 244 are provided with fastening holes 490c and 244c and the fastening members 64 (for example, screws) are fastened through the fastening holes 490c and 244c, the first case 49 may be fixed to the frame 20. In this way, the first case 49 and the frame 20 may be firmly fixed to each other via a simplified structure. In addition, the second ground structure 74 may be configured by fastening the second fastening members 64 through the fastening holes 490c and 244c formed in the fastener 49c and the second portion 244. The second ground structure 74 will be described below in more detail.

In one example, in the embodiment of the invention, the fastener 49c includes a fastening portion 491c fastened to the frame 20. In addition, the fastener 49c may further include extension portions 492c, 493c and 494c connected from the fastening portion 491c to the inner space portion 494. The extension portions 492c, 493c and 494c may include a first extension portion 492c bent from the fastening portion 491c to extend toward the solar cell panel 10, a second extension portion 493c bent from the first extension portion 492c to extend in parallel to the solar cell panel 10, and a third extension portion 494c bent from the second extension portion 493c to extend to the back of the solar cell panel 10 and to the bonding flange 496.

The fastening portion 491c may be positioned to come into contact (or close contact) with the second portion 244 of the frame 20. In one example, the fastening portion 491c may be positioned to come into close contact with an inner surface of the second portion 244 (i.e. a surface facing the back portion 226 or the solar cell panel 10) such that the fastener 49c is positioned in a space inside the extension part 24. In this instance, fastening holes 224c and 490c are formed in corresponding positions of the second portion 244 and the fastening portion 491c coming into close contact with the inner surface of the second portion 244. In addition, holding pieces 490d may be formed at lateral edges of the fastening portion 491c so as to pass through holding holes 244d of the second portion 244. Hence, after the fastener 49c is set to a desired position by fitting the holding pieces 490d of the fastening portion 491c into the holding holes 244d of the second portion 244, the fastener 49c and the second portion 244 may be fixed to each other via the fastening members 62. In the embodiment of the invention, the holding pieces 490d may be protrusions that protrude in a direction opposite to the solar cell panel 10 to pass through the second portion 244, and the holding holes 244d may be formed at positions corresponding to the holding pieces 490d. In this way, positions of the fastener 49c and the second portion 244 may be easily aligned using a simplified structure. In addition, as the holding pieces 490d are formed respectively at both lateral edges of the fastening portion 491c and the two holding holes 244d are formed to correspond to the respective holding pieces 490d, alignment performance may be enhanced. However, the embodiment of the invention is not limited thereto. Thus, various alterations with regard to a coupling structure of the fastener 49c and the frame 20, a coupling structure of the holding pieces 490d and the holding holes 244d, shapes, positions and the number of these components are possible.

The first extension portion 492c may come into contact (or close contact) with the frame 20 (more accurately, the first portion 242). More specifically, the first extension portion 492c may come into contact (or close contact) with an inner surface of the first portion 242. As such, the fastener 49c and the frame 20 may be more firmly fixed to each other.

The second extension portion 493c may be spaced from the solar cell panel 10 or the frame 20. In the embodiment of the invention, the first case part 491 and the second case part 492 may be fastened to each other via third fastening members 66 under the use of the second extension portion 493c. The reason why the second extension portion 493c is spaced from the solar cell panel 10 is to ensure easier coupling of the first case part 491 and the second case part 492. However, the embodiment of the invention is not limited thereto and the first case part 491 and the second case part 492 may be bonded to each other using only the bonding member 493 without an additional fastening method, or may be fastened to each other at different positions. In this instance, the second extension portion 493c may come into close contact with the back surface of the solar cell panel 10 or the back portion 226 of the frame 20 to improve fixing stability. Various other alterations are also possible.

At least one through-hole 490f may be continuously formed in the first extension portion 492c and the second extension portion 493c to ensure easier processing of the fastener 49c that is subjected to bending plural times. To improve ease of processing, a plurality of through-holes 490f may be formed although the embodiment of the invention is not limited thereto. In addition, shapes, sizes and the like of the through-holes 490f are not greatly limited.

When the fastener 49c is bent plural times to include the first to third extension portions 492c, 493c and 494c as well as the fastening portion 491c, the fastener 49c may serve as a reinforcement member, thus having high strength. Thereby, a portion of the fastener 49c coupled to the frame 20 may achieve sufficient strength.

A bracket may be provided to cover the front side of the fastener 49c (i.e. at least a gap between the fastening portion 491c and the third extension portion 494c) so as to improve an external appearance of the fastener 49c. The bracket may be separably fixed to the fastener 49c via a latch structure or the like. However, the embodiment of the invention is not limited thereto and the bracket may be fixed via various other methods.

A portion of the second case part 492 corresponding to the fastener 49c may be provided with a fixture 49d to be fixed to the fastener 49c. The fixture 49d may include a first fixing portion 491d configured to come into contact (or close contact) with the second extension portion 493c and a second fixing portion 492d bent from the fastening portion 491c to extend and be connected to the outer portion 499. The first fixing portion 491d and the second extension portion 493c may have fastening holes 490e and 490g formed at corresponding positions. As the third fastening members 66 are fastened through the fastening holes 490e and 490g, the first case part 491 and the second case part 492 may be more firmly coupled to each other. In this way, the first case 49 may achieve an improved hermetic sealing structure and fixing structure. In addition, in the embodiment of the invention, the third ground structure 76 may be configured by fastening the third fastening members 66 through the fastener 49c and the fixture 49d. This will be described below in more detail.

In the embodiment of the invention, the first case 49 is fixed or attached to the solar cell panel 10. That is, in the embodiment of the invention, an adhesive member 69 may be located at a bottom surface of the first case 49 adjacent to the solar cell panel 10 (for example, the bottom surface 4942 of the first case part 491) to stably fix the solar cell panel 10 to the first case 49 (or the integral inverter 30) and to achieve a good hermetic seal and waterproofing performance.

More specifically, the adhesive member 69 may be configured to define a closed space therein while surrounding the first through-hole 49a of the first case 49 when viewed in plan. As such, the adhesive member 69 may serve to isolate a space between the solar cell panel 10 and the first case 49 defined inside thereof from an external space while allowing the ribbons 122 to be inserted into the first case 49 through the first through-hole 49a of the first case 49. In this way, the adhesive member 69 may hermetically seal the first case 49 having the first through-hole 49a.

As described above, the first case 49 has the first through-hole 49a and the second through-hole 49b. The second through-hole 49b accommodates the AC output cable and, thus, remains in a hermetically sealed state, whereas the first through-hole 49a must be open to ensure smooth passage of the ribbons 122. Therefore, external substances, impurities, moisture and the like may be introduced into the first case 49 through the first through-hole 49a when the adhesive member 69 is not provided. Therefore, in the embodiment of the invention, the adhesive member 69 surrounding the space opened by the first through-hole 49a may serve to prevent the interior of the first case 49 from communicating with the outside through the first through-hole 49a. This may improve hermetic sealing and waterproofing performance of the first case 49. In addition, the adhesive member 69 may fix the first case 49 to the solar cell panel 10, thus improving fixing stability.

In one example, the adhesive member 69 may have a circular shape, a polygonal shape or the like when viewed in plan. As shown in the drawing, the first through-hole 49a may have a rectangular shape and the adhesive member 69 may have a rectangular shape. However, the embodiment of the invention is not limited thereto and the adhesive member 69 may have various other structures and shapes to prevent communication between the first through-hole 49a and the interior of the first case 49.

In the embodiment of the invention, the integral inverter 30 having the first through-hole 49a for connection between the ribbons 122 and the terminals 31 is provided with the adhesive member 69, thus achieving improved hermetic sealing performance. On the other hand, conventional inverters do not have the above-described first through-hole for connection with the solar cells 12.

The adhesive member 69 may be formed of any one of various materials having good adhesive and hermetic sealing properties and the like. In one example, the adhesive member 69 may be a sealant. However, the embodiment of the invention is not limited thereto. Thus, various alterations, such as, for example, an alteration in which the adhesive member 69 is a structure formed of a resin, a metal or the like to thermally attach the first case 49 and the solar cell panel 10 to each other, are possible.

The above-described first case 49 may have a fixed external shape or external surface and may comprise various materials capable of protecting various elements, articles, members and the like arranged therein. In one example, the first case 49 may include a conductive material layer 47 to achieve enhanced structural stability and may be used for grounding and the like. For example, the conductive material layer 47 of the first case 49 may be a metal layer. In this instance, when the first case 49 is formed of a surface treated metal (or coated metal), the conductive material layer 47 may be located inside the first case 49 and a surface treated layer having electrical insulation properties (see reference numeral 48 of FIGS. 12A to 12C) may be located around the conductive material layer 47 to surround the conductive material layer 47. As such, the surface treated layer 48 formed of an electrically insulating material may achieve improved wear-resistance and external appearance and the inner conductive material layer 47 may be used for grounding and the like. The ground structure will be described below in more detail.

In one example, the first case 49 may be formed of an anodized metal (for example, anodized aluminum). As such, the first case 49 may include the conductive material layer 47 comprising aluminum and the surface treated layer 48 comprising aluminum oxide. In addition, upon surface treatment (for example, anodization), the first case 49 may be colored to improve external appearance. For example, the first case 49 may be colored black, brown, silver or the like.

In the embodiment of the invention, the second case 59 may be located inside the first case 49. The second case 59 will be described below in more detail with reference to FIGS. 4 to 6. FIG. 6 shows the first case part 491 of the first case 49, an inner space portion 594 of the second case 59, and the circuit board unit 300 located in the inner space portion 594 and the like.

The second case 59 serves to support or receive the circuit board unit 300 such that the circuit board unit 300 is easily separable from the first case 49. Thus, when repair, replacement or the like is needed, the circuit board unit 300 may be separated from the first case 49 as the first case 49 is opened and then the second case 59 is separated from the first case 49. In addition, when replacement is needed, the second case 59 in which the terminals 31, the bypass diodes 33, the inverter member 35 and the like are supported or received may be simply replaced as the second case 59 is inserted into the first case 49.

The second case 59 may further serve as a receptacle for reception of the potting member 372 that encloses the terminals 31, the bypass diodes 33, the inverter member 35 and the like. That is, as the potting member 372 having fluidity is injected or poured into the second case 59 and then solidified by drying, thermal treatment or the like in a state in which the terminals 31, the bypass diodes 33, the inverter member 35 and the like are arranged in the second case 59, the second case 59, the terminals 31, the bypass diodes 33, the inverter member 35 and the like may be integrated with one another. This may simplify an application process of the potting member 372 and provide a more firmly integrated structure of the bypass diodes 33 and the inverter member 35.

The second case 59 may have any one of various structures to support or receive the terminals 31, the bypass diodes 33, the inverter member 35 and the like.

In one example, in the embodiment of the invention, the second case 59 may include the inner space portion 594 having a bottom surface 5942 located at a portion of the first case 49 except for the first through-hole 49a and lateral surfaces 5944 extending from the bottom surface 5942. When the lateral surfaces 5944 are formed at all edges of the bottom surface 5942, the second case 59 may more effectively perform the role of the receptacle for the potting member 372. However, the embodiment of the invention is not limited thereto and the inner space portion 594 may have only the bottom surface 5942 so as not to define an inner space. In addition, the second case 59 may include a cover portion 592 configured to cover an upper surface of the inner space portion 594. The cover portion 592 is configured so as not to cover the first through-hole 49a and the terminals 31, i.e. to expose the first through-hole 49a and the terminals 31, which may ensure easier connection between the ribbons 122 and the terminals 31. However, the embodiment of the invention is not limited thereto and the cover portion 592 may be omitted.

In addition, in some cases (for example, in the instance in which the first case 49 is conductive), the second case 59 may serve to maintain an electrical insulation distance for a circuit pattern of the circuit board 37 and the like. In this instance, the second case 59 may be formed of an electrically insulating material to maintain an electrical insulation distance between the first case 49 and the circuit board 37. However, the embodiment of the invention is not limited thereto. That is, even when the first case 49 is conductive, the second case 59 may be formed of a conductive material. Alternatively, the second case 59 may be omitted. When the second case 59 does not satisfy the requirement of electrical insulation distance or is omitted, another structure to satisfy the requirement of electrical insulation distance may be provided. This will be described below in more detail with reference to FIG. 8.

Figure 8:
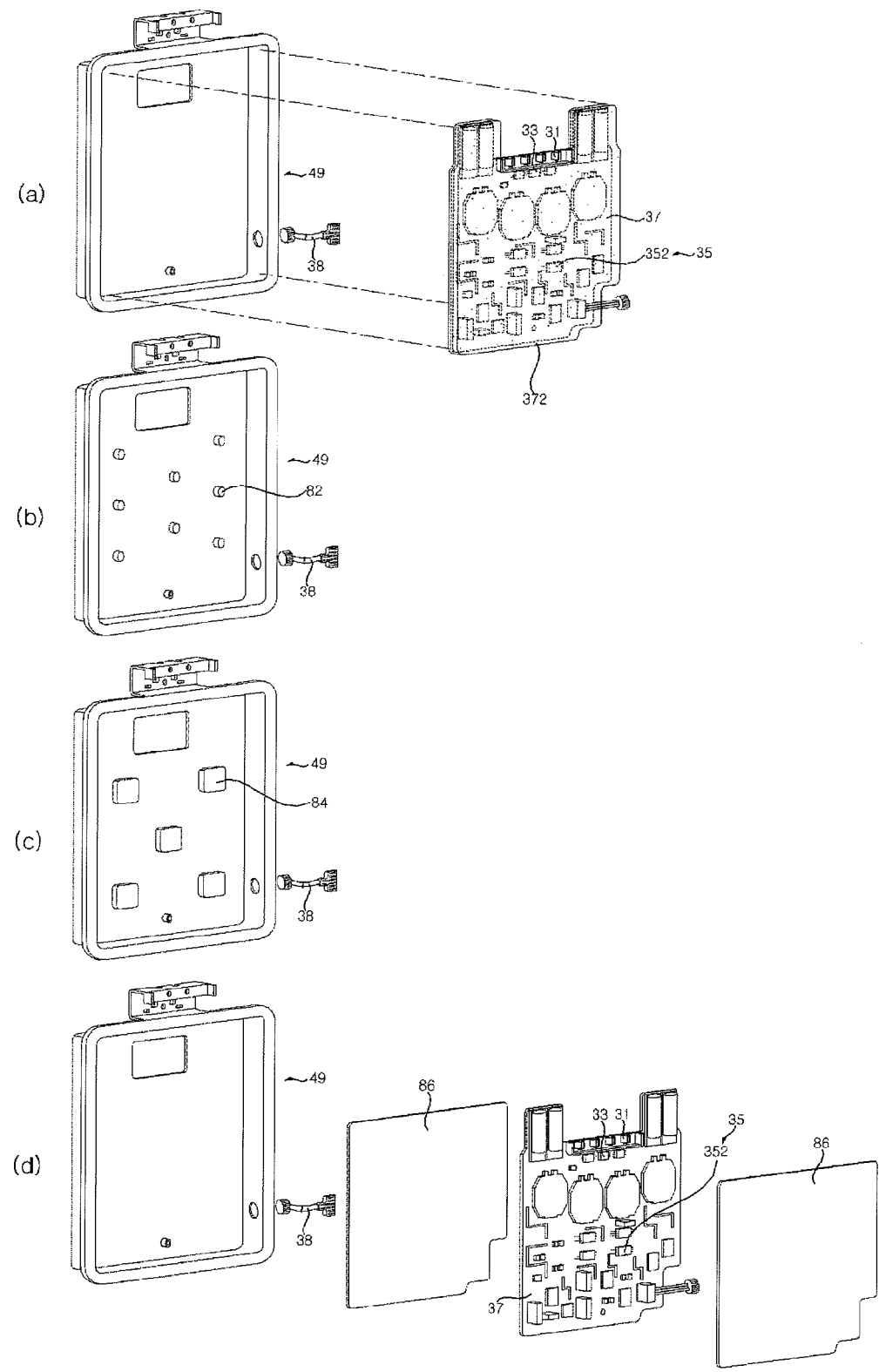
FIG. 8 is a perspective view showing various alternative embodiments which may be applied to the integral inverter of the solar cell module shown in FIG. 1.

FIG. 8 is a perspective view showing various alternative embodiments which may be applied to the integral inverter 30 of the solar cell module 100 shown in FIG. 1. In FIG. 8, for clear and simplified description, only components required for description are shown and illustration of other components is omitted.

For example, as shown by example in (a) of FIG. 8, the terminals 31, the bypass diodes 33, the inverter member 35, the circuit board 37 and the like may be wholly enclosed by the potting member 372 or an additional electrically insulating material. Then, the circuit board unit 300 and the like, enclosed by the potting member 372 or an additional electrically insulating material, may be located in the first case 49 without the second case 59. As such, the potting member 372 or the electrically insulating material may satisfy an electrical insulation distance.

In another example, as shown by example in (b) of FIG. 8, spacers 82 may be arranged in the first case 49 (for example, at an inner surface of the first case part 491). The spacers 82 serve to maintain a constant distance between the first case 49 and the second case 59 or between the first case 49 and the circuit board 37 and are formed of an electrically insulating material. As such, the spacers 82 satisfy an electrical insulation distance. A shape, arrangement and the like of the spacers 82 may be altered in various ways.

In a further example, as shown by example in (c) of FIG. 8, insulation pads 84 may be attached to some positions of an inner surface of the first case 49 (for example, an inner surface of the first case part 491). Alternatively, as shown by example in (d) of FIG. 8, an insulation sheet 86 may be located between the first case 49 and the second case 59 or between the first case 49 and the circuit board 37. Alternatively, the first case 49 may be coated with an electrically insulating material or be subjected by surface treatment to satisfy an electrical insulation distance. Various other methods, structures and the like may also be applied.

The second case 59, the insulation pads 84, the insulation sheet 84 or the like, which is located in the first case 49 at a position between the first case 49 and the circuit board unit 300, may be called an inner member. Various structures, shapes and the like except for the above-described examples may be applied to the inner member.

With reference again to FIGS. 4 to 6, although the drawings show that the second case 59 does not overlap the first through-hole 49a by way of example, the embodiment of the invention is not limited thereto and an opening corresponding to the first through-hole 49a may be formed in the second case 59. In addition, various other structures to allow the ribbons 122, having passed through the first through-hole 49a, to be connected to the terminals 31 through the second case 59, may be applied to the second case 59.

The first case 49 and the second case 59 may be separably coupled to each other via various structures. In one example, in the embodiment of the invention, first clinching nuts (pem nuts) 490h may be located at the first case 49 and fastening holes 590f may be formed in the second case 59 at positions corresponding to the first clinching nuts 490h.

More specifically, the first clinching nuts 490h and the fastening holes 590f may be located respectively at both sides of the terminals 31 connected to the ribbons 122 (or at both sides of the first through-hole 49a) to allow the first case 49 and the second case 59 to be coupled to each other at a portion where the ribbons 122 having passed through the first through-hole 49a are connected to the terminals 31, which may minimize generation of a clearance at the corresponding portion. This enables stable coupling of the ribbons 122. In this instance, fastening portions 590h provided with the fastening holes 590f may extend outward from the lateral surfaces 5944 of the inner space portion 594 of the second case 59 at positions spaced from the bottom surface 5942 by the same height as the first clinching nuts 490h.

The first clinching nuts 490h may be fixed to the first case 49 by caulking or the like. As fastening members 68 are fastened to the first clinching nuts 490h in a state in which the fastening holes 590f of the second case 59 are aligned with the first clinching nuts 490h, the second case 59 may be fixed to the first case 49. The fastening members 68 serve to firmly fix the second case 59 to the first case 49 when tightened and to allow the second case 59 to be easily separated from the first case 49 when loosened.

In addition, a second clinching nut 490i may be located near an edge of the first case 49 opposite to the first clinching nuts 490h. In addition, the second case 59 may have a fastening hole 590i corresponding to the second clinching nut 490i and a fastening hole 37i may be formed in the circuit board 37 (or the circuit board unit 300).

The second clinching nut 490i may be fixed to the first case 49 by caulking or the like. The second clinching nut 490i may protrude from the bottom surface 4944 to the circuit board 37. As such, the second clinching nut 490i serves as a spacer to support the circuit board 37 spaced from the first case 49 by a constant distance and, in turn, to improve fixing stability of the circuit board 37. As the first fastening member 62 is fastened to the second clinching nut 490i in a state in which the fastening hole 590i of the second case 59 and the fastening hole 37i of the circuit board 37 are aligned with the second clinching nut 490i, the second case 59 and the circuit board 37 may be fixed to the first case 49. The first fastening member 62 allows the second case 59 and the circuit board 37 to be firmly fixed to the first case 49 when tightened and to allow the second case 59 and the circuit board 37 to be easily separated from the first case 49 when loosened. In addition, the first ground structure 72 may be formed by fastening the first fastening member 62 through the second clinching nut 490i and the fastening hole 37i. This will be described below in more detail.

The terminals 31, the bypass diodes 33, the inverter member 35 and the like are arranged in the case 39. In the embodiment of the invention, the terminals 31, the bypass diodes 33 and the inverter member 35 are located together on the circuit board 37 to thereby be integrated with one another by the circuit board 37. As such, in the embodiment of the invention, the terminals 31 connected to the ribbons 122 and the bypass diodes 33 are located on the circuit board 37 differently from the related art.

The circuit board 37 may be a board on which various circuit patterns (for example, wirings, terminals, various connection elements on the circuit board 37) are formed. The circuit board 37 may have any one of various structures. In one example, a printed circuit board (PCB) may be used as the circuit board 37. The drawing illustrates that all of the terminals 31, the bypass diodes 33, the inverter member 35 and the like are formed on the single circuit board 37 to achieve a simplified structure. However, the embodiment of the invention is not limited thereto, and a plurality of circuit boards 37 may be provided and connected to one another via other circuit boards (for example, flexible printed circuit boards (FPCBs)), connectors and the like. Various other alterations are also possible.

In the embodiment of the invention, the terminals 31 and/or the bypass diodes 33 are arranged on the circuit board 37. This differs from the related art in which terminals and bypass diodes are arranged in a junction box rather than being arranged on a circuit board. When the terminals 31 and/or the bypass diodes 33 are formed on the circuit board 37, the terminals 31 and the bypass diodes 33 may be connected to each other by a circuit pattern of the circuit board 37 and the bypass diodes 33 and the inverter member 35 may be connected to each other another by the circuit pattern of the circuit board 37, which may result in a simplified connection structure. In addition, a metal plate (for example, a copper plate) forming the circuit board 37 may enhance heat radiation. In particular, since the bypass diodes 33 generate a great quantity of heat during driving, arranging the bypass diodes 33 on the circuit board 37 may greatly enhance heat radiation.

The terminals 31 are connected to the ribbons 122 extending from the solar cells 12 so as to be electrically connected to the solar cell panel 10. As such, the terminals 31 receive direct current voltage or direct current generated by the solar cell panel 10 and transmit the same to the bypass diodes 33 and the inverter member 35.

Figure 9:
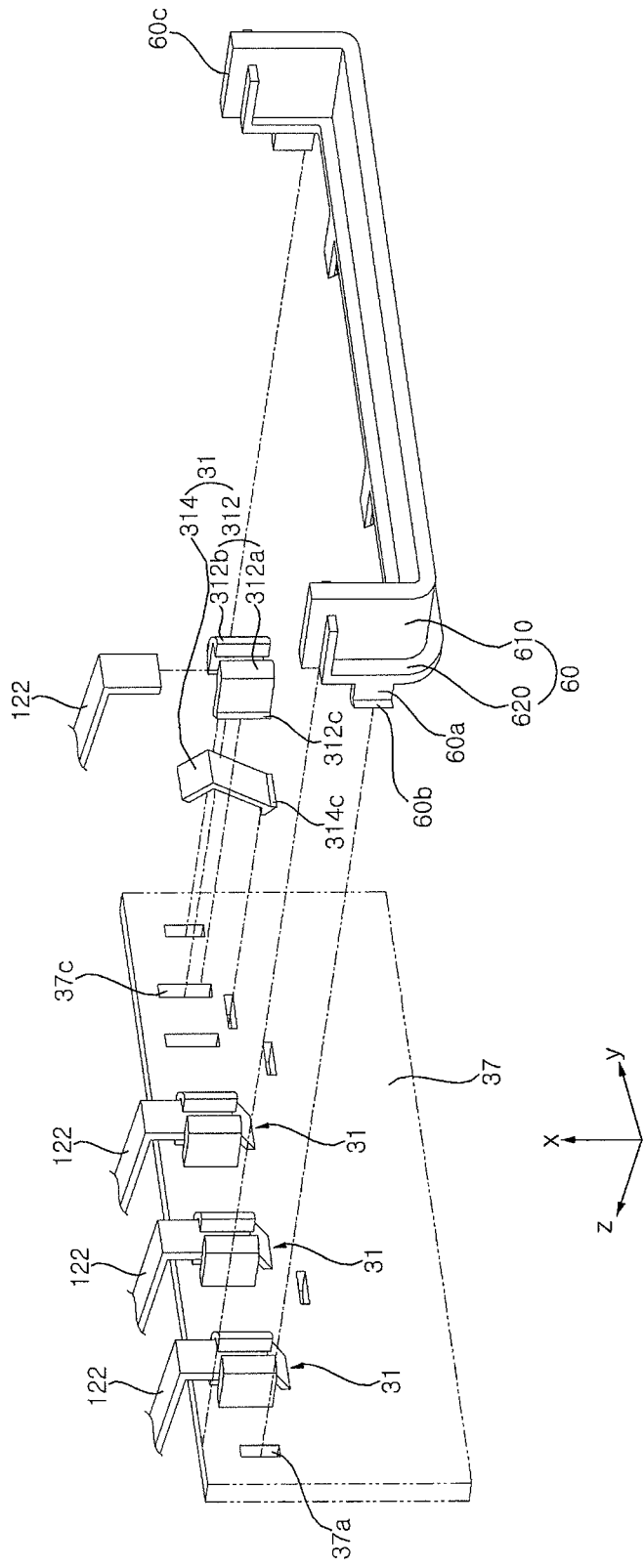
FIG. 9 is a perspective view showing terminals which may be applied to the integral inverter of the solar cell module shown in FIG. 1 and ribbons connected to the terminals.

The terminals 31 connected to the ribbons 122 are located close to one side of the circuit board 37 (more particularly, one edge of the circuit board 37 close to the first through-hole 49a). As the terminals 31 connected to the ribbons 122 are located close to the first through-hole 49a, a path of the ribbons 122 is reduced, which may allow the ribbons 122 to be easily fixed to the terminals 31. A fixing structure of the ribbons 122 and the terminals 31 will be described below in more detail with reference to FIG. 9. FIG. 9 is a perspective view showing the terminals 31 which may be applied to the integral inverter 30 of the solar cell module 100 shown in FIG. 1 and the ribbons 122 connected to the terminals 31.

With reference to FIG. 9, the terminals 31 may be equal in number to the ribbons 122 so as to correspond to the ribbons 122 in a one to one ratio. In the embodiment of the invention, the terminals 31 may be configured so as to be separably coupled to the ribbons 122. For example, in the embodiment of the invention, each of the terminals includes upper parts 312 located above the corresponding ribbon 122 and a lower part 314 located below the ribbon 122. The upper part 312 may include a first upper part 312a fixed to the circuit board 37 at one side of the ribbon 122 so as to extend from the circuit board 37 to the upper one side of the ribbon 122 and a second upper part 312b fixed to the circuit board 37 at the other side of the ribbon 122 so as to extend from the circuit board 37 to the other upper side of the ribbon 122, the first upper part 312a and the second upper part 312b being spaced apart from each other. In addition, the lower part 314 located below the first upper part 312a and the second upper part 312b is fixed to the circuit board 37 at a position farther from the first through-hole 49a than the first and second upper parts 312a and 312b so as to extend upward from the circuit board 37 and then extend in parallel to the ribbon 122 to thereby cross the first and second upper parts 312a and 312b. In addition, a portion of the lower part 314 crossing the first and second upper parts 312a and 312b may have a more upwardly protruding center portion than both end portions thereof. As such, the center portion of the lower part 314 is located closer to the first and second upper parts 312a and 312b than the end portions.

Once a portion of the lower part 314 fixed to the circuit board 37 is pushed downward to increase a distance between the upper parts 312 and the lower part 314 of the terminal 31, the ribbon 122 is inserted between the upper parts 312 and the lower part 314. Then, upon removal of push force applied to the lower part 314 of the terminal 31, the lower part 314 is moved to the upper parts 312, thus causing the ribbon 122 to be fixed between the upper parts 312 (more particularly, the center of the upper parts 312) and the lower part 314. In order to separate the ribbon 122 from the terminal 31, the portion of the lower part 314 fixed to the circuit board 37 is again pushed downward to increase a distance between the upper parts 312 and the lower part 314 and then the ribbon 122 is removed.

The upper parts 312 and the lower part 314 of the terminal 31 may be fixed to the circuit board 37 via various methods. In one example, portions of the upper parts 312 and the lower part 314 fixed to the circuit board 37 may have latches (or holding pieces) 312c and 314c and holding holes 37c may be formed in the circuit board 37 at positions corresponding to the latches 312c and 314c. Thereby, as the latches 312c and 314c of the upper parts 312 and the lower part 314 are fitted into or released from the holding holes 37c of the circuit board 37, the terminal 31 may be easily separated from or coupled to the circuit board 37. However, the embodiment of the invention is not limited thereto and the terminal 31 may be fixed to the circuit board 38 so as not to be separable and various other alterations are possible.

As a result of the terminal 31 being separably coupled to the ribbon 122, the ribbon 122 may be easily separated from the terminal 31 when repair, replacement or the like is needed and then, may again be easily connected to the terminal 31 as needed. However, the embodiment of the invention is not limited thereto and the terminal 31 may have various other structures. In addition, the terminal 31 may be a metal pad, a soldering pad or the like such that the ribbon 122 is bonded to the terminal 31 via welding, soldering or the like. As such, the ribbons 122 may be fixed to the terminals 31 so as not to be separable from the terminals 31. This may simplify a structure of the terminal 31 and reduce manufacturing cost of the terminal 31.

With reference again to FIGS. 4 to 6, the bypass diodes 33 connected to the terminals 31 via the circuit pattern extending from the terminals 31 are arranged on the circuit board 37. The bypass diodes 33 are smaller in number than the terminals 31 by one. That is, assuming that the number of the terminals 31 is n, the number of the bypass diodes 33 is n−1. Each of the bypass diodes 33 may be located between two terminals 31 and connected to the two terminals 31 by the circuit pattern. When a region where power generation does not occur is formed as a portion of the solar cell panel 10 is hidden or due to occurrence of breakdown or the like, the bypass diodes 33 serve to protect the corresponding region by causing current to bypass the region. The bypass diodes 33 may have any one of various known structures.

In addition, the inverter member 35, which is connected to the bypass diodes 33 by the circuit pattern extending from the bypass diodes 33, is arranged on the circuit board 37. The inverter member 35 serves to convert direct current (or direct current voltage), supplied from the bypass diodes 33, into alternating current (or alternating current voltage). The inverter member 35 may include the DC-AC inverters 352 that convert direct current into alternating current and may further include a current sensors 354, capacitors 356, DC-DC converters 358 and the like, which are required to stably convert direct current into alternating current. The current sensors 354, the capacitors 356, the DC-DC converters 358, the DC-AC inverters 352 and the like of the inverter member 35 may be integrated with the terminals 31 and/or the bypass diodes 33 by the circuit board 37 or the circuit pattern formed on the circuit board 37.

The current sensors 354 are connected to the circuit pattern extending from the bypass diodes 33, or connected to the capacitors 356, the DC-DC converters 358, the DC-AC inverters 352 and the like by the circuit pattern. The current sensors 354 serve to sense whether current from the bypass diodes 33 or from the capacitors 356 is normal, the DC-DC converters 358, the DC-AC inverters 352 or the like, thereby selectively stopping operation of the inverter member 35. In the embodiment of the invention, the bypass diodes 33, the current sensors 354, the capacitors 356, the DC-DC converters 358 and the DC-AC inverters 352 may be connected to one another by the circuit pattern formed on the circuit board 37 within the same case 39. Such connection between the bypass diodes 33 and the current sensors 354 eliminates an additional output cable or the like, resulting in a simplified structure.

In the embodiment of the invention, the current sensors 354 are connected to the capacitors 356 which store direct current having passed through the current sensors 354 and transmit current having constant voltage to the DC-DC converters 358. Likewise, the current sensors 354 and the capacitors 356 may be connected to each other by the circuit pattern formed on the circuit board 37 within the same case 39.

The current having constant voltage from the capacitors 356 may be transmitted to the DC-DC converters 358 to thereby be converted into direct current having a different value of constant voltage. In the embodiment of the invention, a plurality of DC-DC converters 358 may be provided. The DC-DC converters 358 enable reduction in a thickness of each DC-DC converter 358 as compared to provision of a single DC-DC converter 358, which may allow a thickness of the integral inverter 30 to be less than a height of the extension part 24. However, the embodiment of the invention is not limited thereto and a single DC-DC converter 358 may be provided.

The direct current or direct current voltage having passed through the DC-DC converters 358 may be transmitted to the DC-AC inverters 352 to thereby be converted into alternating current or alternating current voltage. The alternating current or alternating current voltage, generated by the inverter member 35 as described above, is transmitted outward by the AC output cable 38 that is connected to the integral inverter 30 and passes through the second through-hole 49b of the case 39. For example, the alternating current or alternating current voltage may be transmitted to another solar cell module 100 via the AC output cable 38, or may be transmitted to a power grid, a power system or the like.

The DC-AC inverters 352, the current sensors 354, the capacitors 356 and the DC-DC converters 358 may have various known structures. In addition, various other components, such as a controller 359a, a filter 359b, a communication unit and the like, may be arranged on the circuit board 37. Although the inverter member 35 of the embodiment of the invention includes the current sensors 354, the capacitors 356, the DC-DC converters 358 and the DC-AC inverters 352 arranged in this sequence, the invention is not limited thereto. Thus, positions, connection relationships and the like of the current sensors 354, the capacitors 356, the DC-DC converters 358 and the DC-AC inverters 352 may be changed in various ways. A connection relationship of the inverter member 35 according to another embodiment of the invention will be described below with reference to FIGS. 10 and 11.

As shown by example in FIG. 6, the circuit board 37 as well as the bypass diodes 33 and the inverter member 35 arranged on the circuit board 37 may be enclosed by the potting member 372. In the embodiment of the invention, the potting member 372 may be formed to fill the interior of the inner space portion 594 of the second case 59.

In the embodiment of the invention, the potting member 372 may be formed to cover the bypass diodes 33, the inverter member 35, the circuit board 37 and the like while exposing the terminals 31 connected to the ribbons 122. When the potting member 372 covers the terminals 31 connected to the ribbons 122, the potting member 372 may make it difficult to disconnect the ribbons 122 from the terminals 31 upon replacement of the circuit board unit 300. Therefore, the ribbons 122 may be cut such that only portions thereof exposed outward from the potting member 372 are accessible. This causes reduction in a length of the ribbons 122, thus making it difficult for the ribbons 122 to reach the terminals 31 of the circuit board unit 300 that will be replaced. In addition, when the potting member 372 is even over the terminals 31 of the circuit board unit 300 to be replaced, connection of the ribbons 122 to the terminals 31 may be impossible.

In consideration of the above-described problem, in the embodiment of the invention, the potting member 372 is configured to expose the terminals 31. As such, upon replacement of the circuit board unit 300, the terminals 31 separably coupled to the ribbons 122 may be separated from the ribbons 122. When the terminals 31 are fixed to the ribbons 122 via welding or the like, the terminals 31 may be torn away from the ribbons 122. In this way, the ribbons 122 may be easily separated from the terminals 31 while maintaining an original length thereof. In addition, the ribbons 122 may be easily fixed or connected to the exposed terminals 31 of the circuit board unit 300 to be replaced.

In this instance, in the embodiment of the invention, the partition member 60 may be provided to separate a first region A1 where the terminals 31 are arranged from a second region A2 where the bypass diodes 33, the inverter member 35 and the like are arranged. In addition, the potting member 372 may be located at the second region A2 (or located to cover the second region S2 or to enclose the second region A2). Through provision of the partition member 60, even if the potting member 372 having fluidity is used, it is possible to physically prevent the potting member 372 from flowing to the terminals 31 and covering the terminals 31. As such, the terminals 31 may remain completely exposed.

The partition member 60 may be configured to assist the ribbons 122 in being easily entering the first region A1 where the terminals 31 are arranged while separating the first region A1 and the second region A2 from each other. For example, the partition member 60 may have an opening formed at a position thereof corresponding to a movement path of the ribbons 122 for passage of the ribbons 122. Alternatively, a portion or a face of the partition member 60 corresponding to a movement path of the ribbons 122 may be removed. The removed portion or face may be understood as an opening.

As described above, the terminals 31 of the embodiment of the invention may be located near one side of the circuit board 37 close to the first through-hole 49a. In this instance, the partition member 60 may have an opening at the edge of the circuit board 37 close to the first through-hole 49a, or a portion of the partition member 60 close to the first through-hole 49a may be removed. This may ensure easy connection between the terminals 31 and the ribbons 122. In addition, the partition member 60 may be configured to surround peripheral edges of the terminals 31 except for a peripheral edge corresponding to the above-described one side of the circuit board 37. In this way, it is possible to effectively prevent the potting member 372 from entering a portion of the circuit board 37 except for a connection region between the ribbons 122 and the terminals 31.

The partition member 60 may be fixed to the circuit board 37. As such, the partition member 60 may be stably fixed between the terminals 31 and the bypass diodes 33 and the inverter member 35 with a simplified structure. The partition member 60 may be separably located on the circuit board 37. For example, the circuit board 37 may have holding recesses 37a and both ends of the partition member 60 adjacent to the circuit board 37 may be provided with holding pieces 60a to be caught by the holding recesses 37a. Each of the holding pieces 60a may take the form of a latch. That is, the holding piece 60a may have a latch portion 60b which is gradually increased in width from a narrow end thereof and has a stepped portion from which a width of the holding piece 60a is reduced. As such, when pressure is applied to insert an end of the latch portion 60b into the holding recess 37a, the latch portion 60b having a gradually increasing width passes through the holding recess 37a until the widest portion of the latch portion 60b forms the stepped portion to prevent the latch portion 60b from being unintentionally separated from the holding recess 37a. In this way, the holding piece 60a remains caught by the holding recess 37a so long as additional pressure is not applied. Conversely, the holding piece 60a may be separated from the holding recess 37a when pressure is applied to the latch portion 60b in an opposite direction. With this structure, the partition member 60 may be easily fixed to the circuit board 37 with a simplified structure. In addition, since the holding recess 37a may be formed without considerable change in design of the circuit board 37 that is used in the related art, it is easy to apply the partition member 60 to the circuit board 37. In addition, the circuit board 37 or the partition member 60 may be easily removed or replaced when defects are found.

The partition member 60 may include a partition portion 610 extending perpendicular to the circuit board and a bottom portion 620 located at an end of the partition portion 610 adjacent to the circuit board 37, the bottom portion 620 having a greater width than a width of the partition member 610. The partition portion 610 is not formed at a first side of the terminals 31 (an upper side of the drawing) adjacent to the first through-hole 49a but formed to connect a second side (a lower side of the drawing) opposite to the first through-hole 49a and third and fourth sides (left and right sides of the drawing) located at opposite lateral sides of the terminals 31 to each other. As such, the partition portion 610 may be formed to surround at least three peripheral edges of the terminals 31. The bottom portion 620 may have approximately the same or similar shape as the partition portion 610 and may have a greater width than a width of the partition portion 610. This may maximize a contact area between the partition member 60 and the circuit board 37 at a portion of the partition member 60 adjacent to the circuit board 37, thereby preventing the potting member 372 from flowing between the partition member 60 and the circuit board 37. In addition, the holding pieces 60a, caught by the holding recesses 37a of the circuit board 37, may extend from the bottom portion 620 to achieve enhanced structural stability.

Portions of the partition member 60 corresponding to the aforementioned third and fourth sides may be fixed to the lateral surfaces 5944 of the second case 59. This may effectively prevent an introduction path of the potting member 372.

Ends of the partition member 60 adjacent to the first through-hole 49a may be provided with protrusions 60c to be fitted into the lateral surface 5944 of the second case 59. The lateral surfaces 5944 of the second case 59 may have insertion recesses 590c into which the protrusions 60c are fitted. The partition member 60 may be fixed to the second case 59 as the protrusions 60c are fitted into the insertion recesses 590c. As such, the ends of the partition member 60 adjacent to the circuit board 37 are fixed to the circuit board 37 by the holding pieces 60a and the ends of the partition member 60 adjacent to the first through-hole 49a are fixed to the lateral surfaces 5944 of the second case 59 by the protrusions 60c. Alternatively, an adhesive or the like may be provided between the protrusions 60c and the insertion recesses 590c. Alternatively, as the potting member 372 adhesively fills a gap between the protrusions 60c and the insertion recesses 590c, the potting member 372 may no longer pass through the gap. Various other alterations are also possible.

The protrusions 60c protrude from one side of the circuit board 37 adjacent to the first through-hole 49a and, in other words, protrude from the circuit board 37 throughout one side of the circuit board 37 adjacent to the first through-hole 49a, thereby effectively blocking an introduction path of the potting member 372.

The potting member 372 having fluidity in a liquid state or in a gel state may be poured into the second region A2 in a state in which the circuit board unit 300 and the partition member 60 are arranged in the second case 59, and then solidified by drying and/or thermal treatment so as to cover the second region A2. As the potting member 372 is introduced in a state in which the circuit board unit 300 is located in the second case 59, the potting member 372 covering the circuit board unit 300 may be easily formed without an additional mold or the like. In this instance, through provision of the partition member 60, the potting member 372 is not formed at the first region A1 where the terminals 31 are arranged and is formed throughout the second region A2. This allows the potting member 372 to cover the bypass diodes 33, the inverter member 35 and the circuit board 37 arranged at the second region A2 except for the first region A1.

The above description exemplifies that an upper surface of the circuit board 37 (i.e. a portion opposite to the bottom surface 5944 of the second case 59) is divided into the first region A1 and the second region A2 for introduction of the potting member 372 by the partition member 60. However, the embodiment of the invention is not limited thereto and the partition member 60 may be replaced with a portion of the second case 59.

For example, a partition portion 5960 may integrally protrude from the bottom surface 5944 of the second case 59 to separate the first region A from the second region A2, thereby serving to prevent introduction of the potting member 372 into the first region A1. In this instance, the first region A1 defined above the circuit board 37 by the partition member 60 may have a different planar shape from that of a region defined by the partition portion 610 that is formed at the bottom surface 5944 of the second case 59 and located below the circuit board 37. For example, differently from the partition member 60, the partition portion 5960 of the embodiment of the invention may be shaped to separate a portion where the terminals 31 are arranged and a portion where the capacitors 356 are arranged from the remaining portion. This is because a portion where the potting member 372 is not introduced may be freely designed into a desired shape based on arrangement of components at upper and lower portions of the circuit board 37. Various other alterations are also possible.

In the above description, that the potting member 372 covers objects such as the bypass diodes 33 and the inverter member 35 includes covering the entirety of the objects, but also includes only covering some portions of the objects. That is, in the instance in which the bypass diodes 33, the inverter member 35 and the like have portions processed to exhibit electrical insulation properties, the potting member 372 may cover the remaining portions of these components except for the processed portions. For example, the potting member 372 may cover some portions corresponding to the circuit pattern, such as wirings, exposed outward from the bypass diodes 33, the inverter member 35 and the like. Thus, it can be appreciated that covering the circuit pattern of the bypass diodes 33 and the inverter member 35 may mean potting by the potting member 372. In addition, even if at least one of the DC-AC inverters 352, the current sensors 354, the capacitors 356 and the DC-DC converters 358 of the inverter member 35 is covered and potted by the potting member 372 and the other components are not covered by the potting member 372, it can be said that the inverter member 35 is potted by the potting member 372. For example, in some embodiments, the capacitors 356 and the like may not be potted by the potting member 372.

Figure 10:
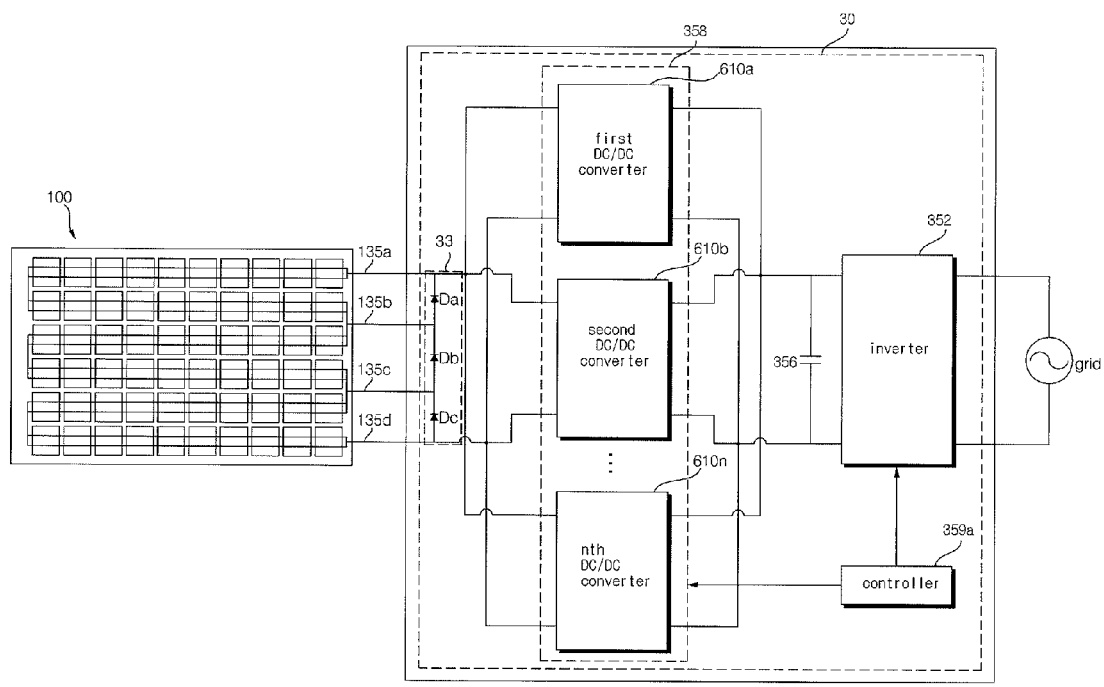
FIG. 10 is an example block diagram showing the terminals of the solar cell module shown in FIG. 1 and the integral inverter.

An inner circuit of the integral inverter 30 (more accurately, a structure of the circuit board unit 300) according to another embodiment of the invention will be described below in detail with reference to FIGS. 10 and 11. FIG. 10 is an example block diagram showing the terminals and the integral inverter of the solar cell module shown in FIG. 1.

With reference to the drawings, the integral inverter 30 may include the bypass diodes 33 (or a bypass diode unit) 33, the DC-DC converter 358 (or a converter unit), a capacitor 356, the DC-AC inverter 352 (or an inverter unit), and a controller 359a.

The bypass diodes 33 may include bypass diodes Da, Db and Dc, which are respectively arranged between first to fourth conducting lines 135a, 135b, 135c and 135d of the solar cell module 100 formed via the ribbons (see reference numeral 122 of FIG. 4) and the terminals (see reference numeral 31 of FIG. 4). In this instance, one or more bypass diodes may be provided, and the number of the bypass diodes is preferably smaller than the number of the conducting lines (the number of the terminals 31 or the number of the ribbons 122) by one.

The bypass diodes Da, Db and Dc receive direct current power, which is generated using sunlight, from the solar cell module 100, more particularly, from the first to fourth conducting lines 135a, 135b, 135c and 135d of the solar cell module 100. In addition, the bypass diodes Da, Db and Dc may bypass the direct current power when inverse voltage occurs in the direct current power from at least one of the first to fourth conducting lines 135a, 135b, 135c and 135d.

Meanwhile, input power Vpv having passed through the bypass diodes 33 is input to the DC-DC converter 358.

The DC-DC converter 358 converts the input power Vpv output from the bypass diodes 33. Meanwhile, the DC-DC converter 358 may be called a first power converter.

For example, the DC-DC converter 358 may convert the input direct current power Vpv into power having pseudo DC voltage. As such, the capacitor 356 may store power having pseudo DC voltage. Meanwhile, both ends of the capacitor 356 may be called DC terminals and the capacitor 356 may be called a DC terminal capacitor. In another example, the DC-DC converter 358 may boost the input direct current power Vpv to convert the same into direct current power. As such, the DC terminal capacitor 356 may store the boosted direct current power.

The DC-AC inverter 352 may convert the direct current power stored in the capacitor 356 into alternating current power. Meanwhile, the DC-AC inverter 352 may be called a second power converter.

For example, the DC-AC inverter 352 may convert the power having pseudo DC voltage, converted by the DC-DC converter 358, into alternating current power. In another example, the DC-AC inverter 352 may convert the direct current power, boosted by the DC-DC converter 358, into alternating current power.

Meanwhile, the DC-DC converter 358 preferably includes a plurality of interleaving converters for conversion to power having pseudo DC voltage or conversion to power having boosted direct current.

In particular, the embodiment of the invention exemplifies that the DC-DC converter 358 includes three or more interleaving converters.

The drawing shows that n converters 610a, 610b, ..., 610n are connected to one another in parallel. The n converters 610a, 610b, ..., 610n may have the same energy conversion capacity.

The magnitude of the input direct current power Vpv is reduced to 1/N by the n converters 610a, 610b, ..., 610n, and output current of the respective converters is merged at an output terminal of the n converters 610a, 610b, ..., 610n.

Meanwhile, the n converters 610a, 610b, ..., 610n perform interleaving operation, and each of the n converters 610a, 610b, ..., 610n maintains a current phase of +(360°/N) or −(360°/N) relative to a reference phase or a phase delay close to the current phase.

When the n converters perform interleaving operation as described above, ripples of input current and output current of the DC-DC converter 358 are reduced. This advantageously reduces the capacity and size of circuit elements in a power conversion module 700.

Meanwhile, as described above, when two interleaving converters are used, a large inductor, a large transformer and the like are required to output alternating current power within a range of 290 W to 330 W. As the inductor, the transformer and the like are increased in size, it is necessary to increase a thickness of a junction box and, in turn, a thickness of the integral inverter 30 may be greater than a thickness of the frame 20 of the solar cell module 100.

To solve the above-described problems, in the embodiment of the invention, at least three interleaving converters are used. Thereby, smaller sizes of inductor, transformer and the like may be used to output the aforementioned alternating current power within a range of 290 W to 330 W and, in turn, a thickness of the integral inverter 30 may be less than a thickness of the frame 20 of the solar cell module 100.

Meanwhile, the interleaving converters may be tapped inductor converters, flyback converters, or the like.

Figure 11:
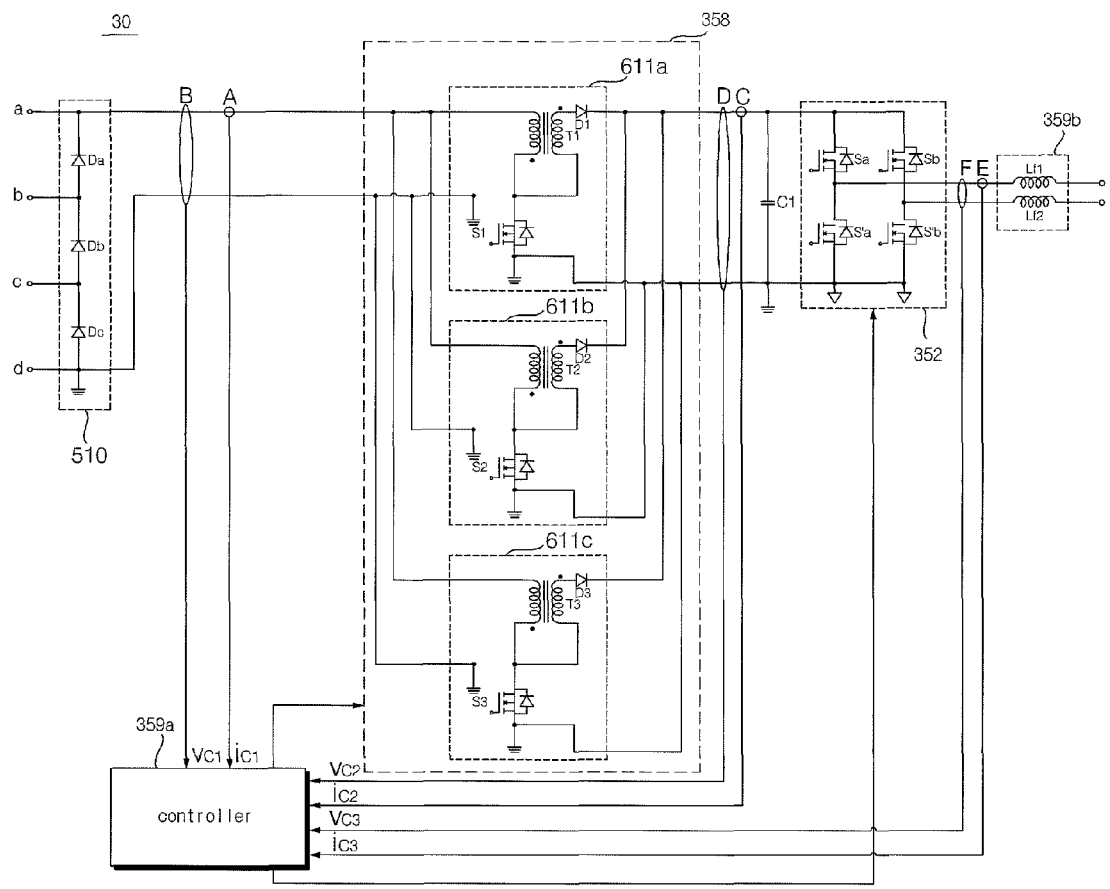
FIG. 11 is an example circuit diagram of the integral inverter shown in FIG. 10.

FIG. 11 is an example circuit diagram of the integral inverter of FIG. 10.

With reference to the drawing, the integral inverter 30 may include the bypass diodes 33, the DC-DC converter 358, the capacitor 356, the DC-AC inverter 352, the controller 359a and the filter 359b.

FIG. 11 shows a tapped inductor converter as an interleaving converter. In the drawing, the DC-DC converter 358 includes first to third tapped inductor converters 611a, 611b and 611c.

The bypass diodes 33 include first to third bypass diodes Da, Db and Dc, which respectively correspond to the first to fourth conducting lines 135a, 135b, 135c and 135d and are arranged between nodes a, b, c and d.

The DC-DC converter 358 may perform power conversion using direct current power Vpv output from the bypass diodes 33.

In particular, the first tapped inductor converter to the third tapped inductor converter 611a, 611b and 611c output direct current power, converted via interleaving operation, to the capacitor 356.

The first tapped inductor converter 611a includes a tapped inductor T1, a switching element S1 connected between the tapped inductor T1 and a ground terminal, and a diode D1 connected to an output terminal of the tapped inductor T1 to perform unidirectional conduction. Meanwhile, the capacitor 356 is connected between an output terminal of the diode D1, i.e. a cathode and the ground terminal.

More specifically, the switching element S1 may be connected between a tap of the tapped inductor T1 and the ground terminal. In addition, an output terminal (secondary side) of the tapped inductor T1 is connected to an anode of the diode D1, and the capacitor 356 is connected between the cathode of the diode D1 and the ground terminal.

Meanwhile, the primary side and the secondary side of the tapped inductor T1 have opposite polarities. Meanwhile, the tapped inductor T may be called a transformer.

The primary side and the secondary side of the tapped inductor T1 are connected to each other as shown in the drawing. As such, the tapped inductor converter may be a non-isolated converter.

Meanwhile, when the three tapped inductor converters 611a, 611b and 611c are connected to one another in parallel as shown in the drawing so as to be driven in an interleaving manner, input current is diverged in parallel and, thus, ripples of current output through the respective tapped inductor converters 611a, 611b and 611c are reduced.

The respective tapped inductor converters 611a, 611b and 611c may be operated adaptively to correspond to a required value of the output alternating current power.

For example, when a required power value is within a range of approximately 90 W to 130 W, only the first converter 611a may be operated. When a required power value is within a range of approximately 190 W to 230 W, only the first and second converters 611a and 611b may be operated. When a required power value is within a range of approximately 290 W to 330 W, all of the first to third converters 611a, 611b and 611c may be operated. That is, the respective tapped inductor converters 611a, 611b and 611c may be selectively operated. This selective operation may be controlled by the controller 359a.

The DC-AC inverter 352 converts the DC power converted in level by the DC-DC converter 358 into AC power. The drawing illustrates a full bridge inverter. That is, upper arm switching elements Sa and Sb connected to each other in series are paired and lower arm switching elements S'a and S'b connected to each other in series are paired, such that two pairs of upper and lower arm switching elements Sa & S'a and Sb & S'b are connected to one another in parallel. The respective switching elements Sa, S'a, Sb and S'b are connected to the diodes in anti-parallel.

The switching elements in the DC-AC inverter 352 may be turned on or off based on an inverter switching control signal from the controller 359a. Thereby, AC power having a prescribed frequency is output. Preferably, the AC power may have the same frequency as an AC frequency of a grid (for example, approximately 60 Hz or 50 Hz).

The filter 359b performs low-pass filtering to smooth the AC power output from the DC-AC inverter 352. To this end, the drawing illustrates inductors Lf1 and Lf2, but various other examples are possible.

Meanwhile, a converter input current sensing unit A senses input current ic1 input to the DC-DC converter 358, and a converter input voltage sensing unit B senses input voltage vc1 input to the DC-DC converter 358. The sensed input current ic1 and the sensed input voltage vc1 may be input to the controller 359a.

A converter output current sensing unit C senses output current ic2 output from the DC-DC converter 358, i.e. DC terminal current, and a converter output voltage sensing unit D senses output voltage vc2 output from the DC-DC converter 358, i.e. DC terminal voltage. The sensed output current ic2 and the sensed output voltage vc2 may be input to the controller 359a.

An inverter output current sensing unit E senses current ic3 output from the DC-AC inverter 352, and an inverter output voltage sensing unit F senses voltage vc3 output from the DC-AC inverter 352. The sensed current ic3 and the sensed voltage vc3 are input to the controller 359a.

The converter input current sensing unit A, the converter input voltage sensing unit B, the converter output current sensing unit C, the converter output voltage sensing unit D and the inverter output current sensing unit E may correspond to the current sensors 354 shown in FIG. 4.

Meanwhile, the controller 359a may output a control signal to control a switching element S1 of the DC-DC converter 358. In particular, the controller 359a may output a turn-on timing signal for the switching element S1 in the DC-DC converter 358 based on at least one of the sensed input current ic1, the sensed input voltage vc1, the sensed output current ic2, the sensed output voltage vc2, the sensed output current ic3, or the sensed output voltage vc3.

The controller 359a may also output an inverter control signal to control the respective switching elements Sa, S'a, Sb and S'b of the DC-AC inverter 352. In particular, the controller 359a may output turn-on timing signals of the respective switching elements Sa, S'a, Sb and S'b of the DC-AC inverter 352 based on at least one of the sensed input current ic1, the sensed input voltage vc1, the sensed output current ic2, the sensed output voltage vc2, the sensed output current ic3 or the sensed output voltage vc3.

Meanwhile, the controller 359a may calculate the maximum power point with respect to the solar cell module 100 and control the DC-DC converter 358 to output DC power corresponding to the maximum power.

The integral inverter 30 according to the embodiment of the invention in which an inner circuit structure is integrated with the bypass diodes 33 may be differentiated from the related art in which terminals, bypass diodes and an inverter member are individually formed.

As described above, in the embodiment of the invention, in a state in which the first case part 491 is fixed to the solar cell panel 10, the first case part 491 is open to enable repair or replacement of the circuit board unit 300. This may ensure easy repair and replacement of the circuit board unit 300. In addition, the first case 49 may remain because the circuit board unit 300 alone may be replaced. Thus, even when the integral inverter 30 breaks, the first case 49 may remain, resulting in reduced repair costs. In particular, when the first case 49 is formed of a metal to enhance durability and the like, repair costs may be greatly reduced.

Figure 12A:
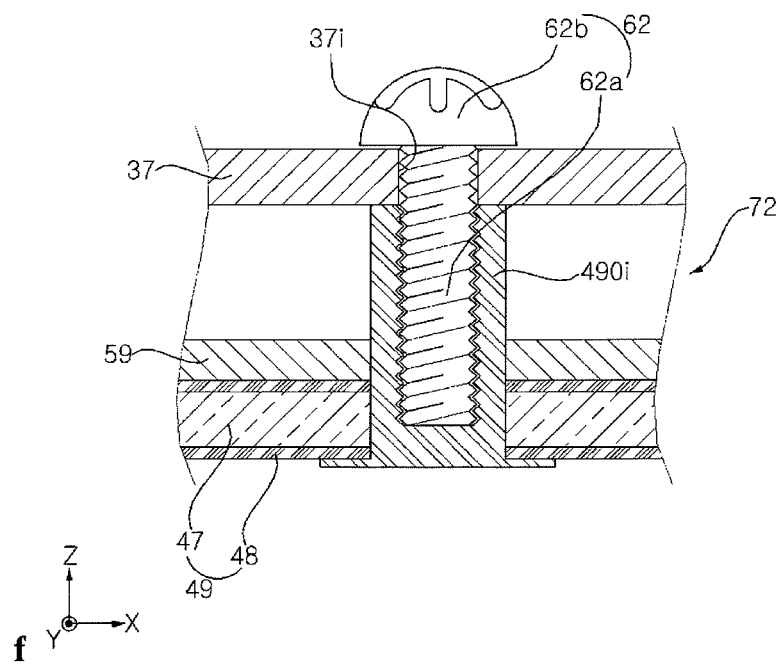
FIG. 12A is a sectional view taken along line A-A of FIG. 4.
Figure 12B:
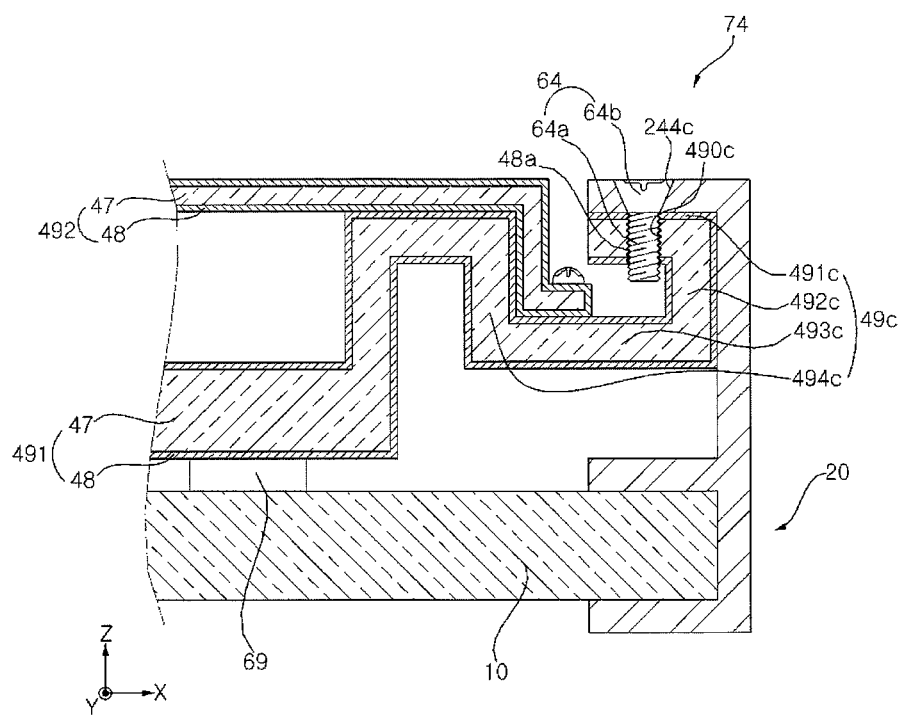
FIG. 12B is a sectional view taken along line B-B of FIG. 4.
Figure 12C:
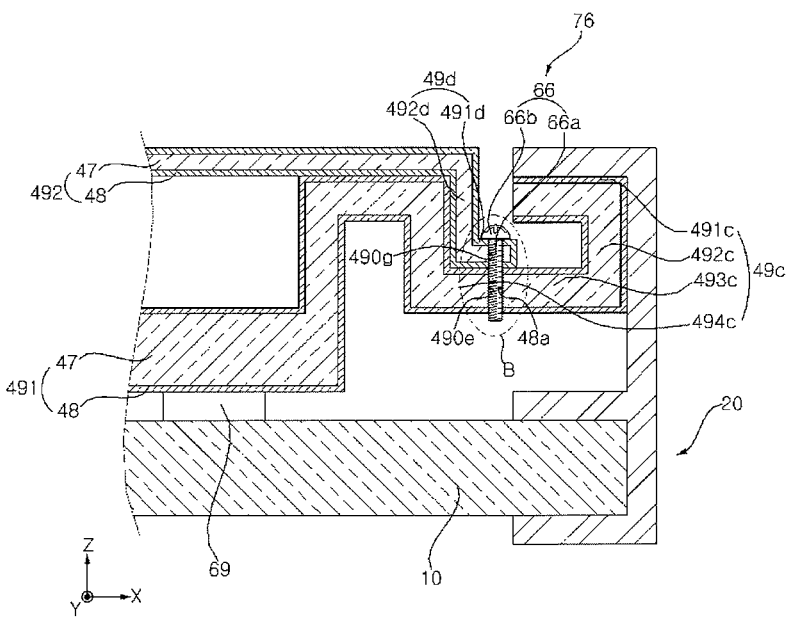
FIG. 12C is a sectional view taken along line C-C of FIG. 4.

Hereinafter, a ground structure of the integral inverter 30 according to the embodiment of the invention will be described below in detail with reference to FIGS. 12A, 12B and 12C. FIGS. 12A, 12B and 12C are sectional views respectively showing the first to third ground structures 72, 74 and 76 which may be applied to the integral inverter 30 shown in FIG. 4. Here, FIG. 12A is a sectional view taken along line A-A of FIG. 4, FIG. 12B is a sectional view taken along line B-B of FIG. 4, and FIG. 12C is a sectional view taken along line C-C of FIG. 4. In FIGS. 12A to 12C, only parts required for description are shown in brief.

With reference to FIGS. 12A to 12C, in the embodiment of the invention, grounding by the first case 49 may be accomplished via fastening of the first to third fastening members 62, 64 and 66. In this instance, the first to third fastening members 62, 64 and 66 may comprise a conductive material (for example, a metal). The first case 49 may include the conductive material layer 47 and the surface treated layer 48 formed on a surface of the conductive material layer 47. In addition, at least a portion of the surface treated layer 48 where the second and third fastening members 64 and 66 are to be fastened to the first case 49 are located is removed to form a contact portion 48a at which the conductive material layer 47 is exposed. The second and third fastening members 64 and 66 come into contact with the conductive material layer 47 through the contact portion 48a so as to be electrically connected to each other, thereby forming a ground structure. This will be described below in more detail.

With reference to FIG. 12A, the first ground structure 72 may include the second clinching nut 490i located at the first case 49, the fastening hole 37i formed in the circuit board 37 at a position corresponding to the second clinching nut 490i, and the first fastening member 62 fastened into the clinching nut 490i through the fastening hole 37i. That is, as the first fastening member 62 is fastened through the fastening hole 37i in a state in which the fastening hole 37i of the circuit board 37 is located above the second clinching nut 490i protruding from the bottom surface 4942 of the inner space portion 494 of the first case 49 toward the circuit board 37, an inner surface of the second clinching nut 490i comes into contact with a threaded portion 62a of the first fastening member 62, thereby achieving grounding.

The second clinching nut 490i may be formed of a conductive material and be easily electrically connected by the threaded portion 62a of the first fastening member coming into contact with the inner surface of the second clinching nut 490i. In addition, an inner surface of a head portion 62b of the first fastening member 62 may be connected to the circuit board 37, a metal plate constituting the circuit board 37, a circuit pattern of the circuit board 37 or the like.

However, the embodiment of the invention is not limited thereto and the second clinching nut 490i may be provided at a surface thereof with the surface treated layer 48 formed of an electrically insulating material or the like, similar to the first case part 491 or the second case part 492 of the first case 49. Through provision of the surface treated layer 48, when the second clinching nut 490i is fastened to the first fastening member 62, the surface treated layer 48 formed at the inner surface of the second clinching nut 490i is removed by the threaded portion 62a, thus causing the threaded portion 62a to come into contact with the conductive material. Alternatively, an additional process of removing the surface treated layer 48 from the inner surface of the second clinching nut 490i before fastening of the first fastening member 62 may be performed to achieve stable contact between the first fastening member 62 and the conductive material of the second clinching nut 490i. Various other alterations are also possible.

When the second clinching nut 490i and the circuit board 37 are connected to each other by the first fastening member 62, the circuit board 37 may be stably grounded to the first case 49. Thereby, the circuit board having any of various circuit patterns, the bypass diodes 33, the inverter member 35 and the like may be connected to the first case 49 (more accurately, the first case part 491) to form a ground passage, thereby maintaining grounding potential of the circuit board 37.

When the first ground structure 72 is formed by fastening the first fastening member 62 through the second clinching nut 490i located at the first case 49 and the fastening hole 37i formed in the circuit board 37, the first ground structure 72 may be formed via a simplified structure and process. In addition, as the first case 49 and the circuit board 37 are mechanically connected to each other by the first fastening member 62, improved fixing stability of the first case 49 and the circuit board 37 may be accomplished.

With reference to FIG. 12B, the second ground structure 74 may be configured by fastening the fastener 49c of the first case 49 to the frame 20 via the second fastening member 64. That is, the second ground structure 74 is formed as the second fastening member 64 is fastened through the fastening hole 490c of the fastener 49c and the fastening hole 244c of the second portion 244 in a state in which the fastening portion 491c of the fastener 49c of the first case 49 comes into contact with an inner surface of the second portion 244 of the frame 20. In this instance, the frame 20 may be formed of a conductive material to achieve good durability against external shock. In one example, the frame 20 may be formed of a metal or the like.

In this instance, the surface treated layer 48 of the first case 49 is removed from an inner surface of the fastening hole 490c in which the second fastening member 64 is located to form the contact portion 48a where the conductive material layer 47 is exposed. A shape of the contact portion 48a will be described below in more detail with reference to FIGS. 13A to 13D.

When the fastening portion 491c and the second portion 244 are fastened to each other by the second fastening member 64, a ground path may be formed via connection of the first case 49 (more accurately, the first case part 491) and the frame 20. As the circuit board 37 and the first case 49 are grounded by the first ground structure 72 and the first case 49 and the frame 20 are grounded by the second ground structure 74, a ground path may be formed through the circuit board 37, the first case 49 and the frame 20. In this way, a simplified ground structure may be accomplished as constituent elements of the solar cell module 100, i.e. the first case 49, the frame 20 and the like configure a ground path. In addition, the frame 20 may be connected to the frame 20 of a neighboring solar cell module 100 to form a continuous ground structure between the neighboring solar cell modules 100. The frame 20 may be provided with a ground line or any of various other ground structures.

The second ground structure 74 may be formed via a simplified structure and process by fastening the fastening portion 491c to the second portion 244 using the second fastening member 64. In addition, the first case 49 and the frame 20 may be mechanically fixed to each other by the second fastening member 64, which may allow the first case 49 to be more firmly fixed to the solar cell module 100.

However, the embodiment of the invention is not limited thereto and the second ground structure 74 may be omitted. For example, when the frame 20 comprises no conductive material, the second ground structure 74 is not provided. Thus, the first case 49 may be provided with a separate ground line for grounding. Various other alterations are also possible, With reference to FIG. 12C, the third ground structure 76 may be configured by fastening the extension portions 492c, 493c and 494c of the first case part 491 (more particularly, the second extension portion 493c) to the fixture 49d of the second case part 492 using the third fastening member 66. That is, the third ground structure 76 is formed as the third fastening member 66 is fastened through the fastening hole 490e of the second extension portion 493c and the fastening hole 490g of the first fixing portion 491d in a state in which the second extension portion 493c of the fastener 49c of the first case 49 comes into contact with the fixing portion 491d of the fixture 49d.

In this instance, the surface treated layer 48 of the first case 49 is removed from an inner surface of the fastening holes 490e and 490g in which the third fastening member 66 is located to form the contact portion 48a where the conductive material layer 47 is exposed. A shape of the contact portion 48a will be described below in more detail with reference to FIGS. 13A to 13D.

When the fastener 49c and the fixture 49d are fastened to each other by the third fastening member 66, a ground path may be formed via connection of the first case part 491 and the second case part 492. As the circuit board 37 and the first case part 491 are grounded by the first ground structure 72, the first case part 491 and the second case part 492 are grounded by the third ground structure 76 and the first case part 491 and the frame 20 are grounded by the second ground structure 74, a ground path may be formed through the circuit board 37, the first and second case parts 491 and 492 of the first case 49 and the frame 20. In this way, a simplified ground structure may be formed without additional elements and the like as constituent elements of the solar cell module 100, i.e. the first and second case parts 491 and 492 of the first case 49, the frame 20 and the like configure a ground path.

The third ground structure 76 may be formed via a simplified structure and process by fastening the fastener 49c to the fixture 49d using the third fastening member 66. In addition, the first case part 491 and the second case part 492 may be mechanically fixed to each other by the third fastening member 66, which may provide more firm fixing therebetween.

The embodiment of the invention exemplifies that the second case part 492 includes the conductive material layer 74 and the surface treated layer 48 in the same manner as the first case part 491. When the second case part 492 includes the conductive material layer 47 and the surface treated layer 48, the first case 49 may achieve enhanced strength and wear-resistance, improved external appearance and the like. However, the embodiment of the invention is not limited thereto, and the first case part 491 and the second case part 492 may be formed of different materials. For example, the second case part 492 may be formed of an electrically insulating material, thus having electrical insulation properties. When the second case part 492 is formed of an electrically insulating material, the third ground structure 76 may be omitted.

In the embodiment of the invention, the contact portion 48a is formed as the surface treated layer 48 of the first case 49 is removed from positions where the second and third fastening members 64 and 66 are located. Various examples related to this formation of the contact portion 48a will be described below in detail with reference to FIGS. 13A to 13D. FIGS. 13A to 13D are views showing various examples of the contact portion 48a formed by the third fastening member 66 shown in FIG. 12C. A description related to the contact portion 48a formed by the third fastening member 66 with reference to FIG. 13 may be applied to a description related to the contact portion 48a formed by the second fastening member 64 and the second ground structure 74 formed by the contact portion 48a. Thus, a description related to the second fastening member 64 will be replaced with a description related to the third fastening member 66 and the second fastening member 64 will not be described below in detail. FIGS. 13A to 13D show a portion corresponding to portion B of FIG. 12C.

Figure 13A:
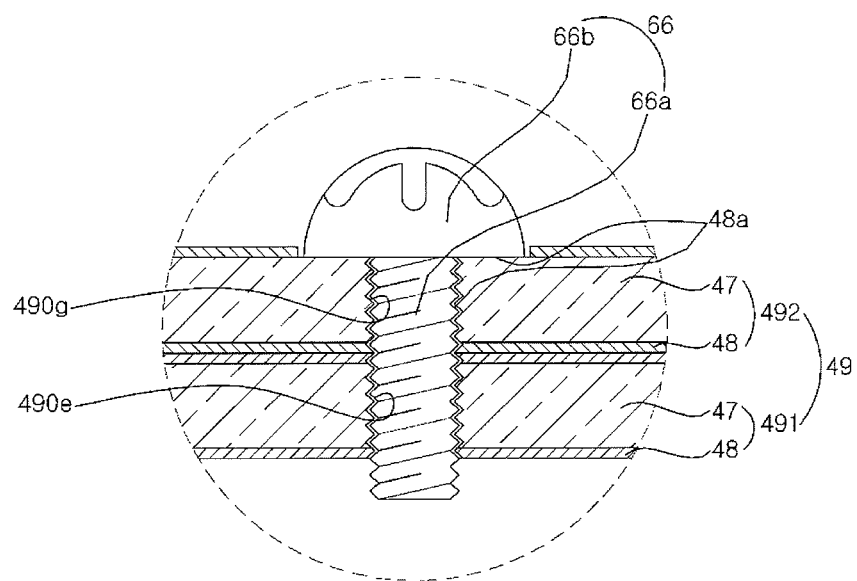
FIGS. 13A to 13D are views showing various examples of a contact portion formed by a third fastening member shown in FIG. 12C.

As shown by example in FIG. 13A, the contact portion 48a is formed by removing a portion of the surface treated layer 48 corresponding to a head portion 66b and a threaded portion 66a of the third fastening member 66 so as to expose the conductive material layer 47 adjacent to the third fastening member 66. In other words, the contact portion 48a may be formed at the entire inner surfaces of the fastening holes 490e and 490f coming into contact with the threaded portion 66a and at the entire surface of the first case 49 coming into contact with an inner surface of the head portion 66*b*. The contact portion 48*a* may be formed by performing laser processing, mechanical processing (for example, end mill processing) or the like on the portion corresponding to the head portion 66*b* and the threaded portion 66*a* of the third fastening member 66 prior to fastening the third fastening member 66. When the entire contact portion 48*a* is formed via laser processing or mechanical processing, the third ground structure 76 may be more stably formed.

Figure 13B:
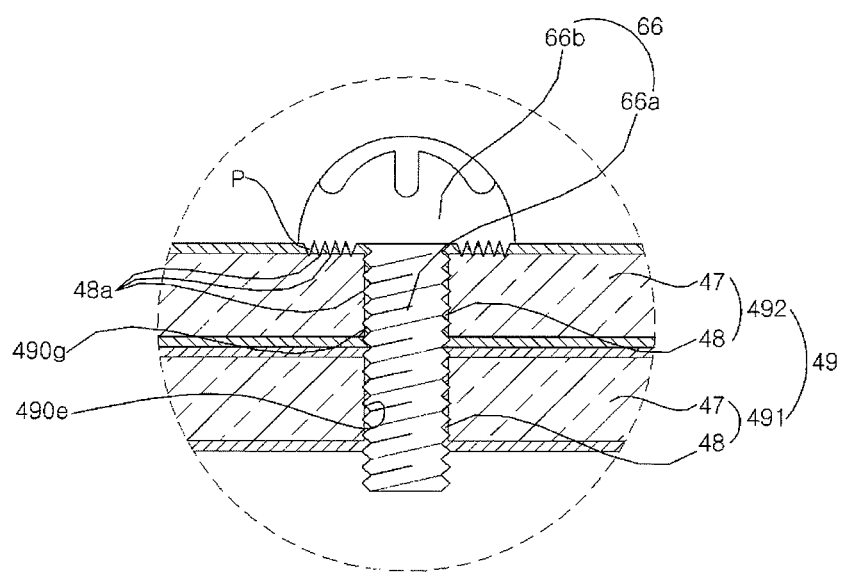
Figure 13C:
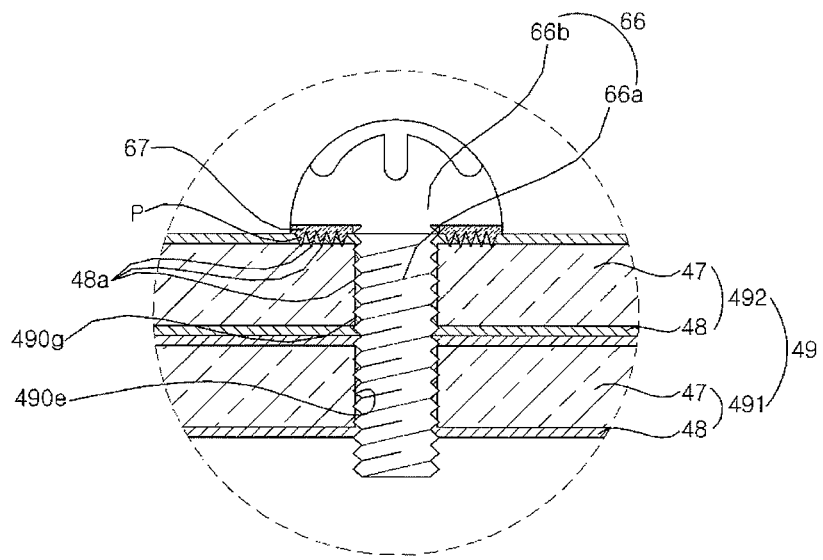

Alternatively, as shown by example in FIG. 13B, the contact portion 48*a* may be formed to partially expose a portion corresponding to the head portion 66*b* and the threaded portion 66*a* of the third fastening member 66. The contact portion 48*a* may be formed as the third fastening member 66 cuts the surface treated layer 48 of the first case 49 coming into contact therewith the third fastening member 66 upon fastening through the fastening holes 490*e* and 490*g*. In this instance, the head portion 66*b* may be provided with ridges P protruding toward the first case 49 to effectively remove the surface treated layer 48. The ridges P may have any of various shapes. In one example, the ridges P may have any of various shapes, such as a comb pattern, a circular pattern, a starred pattern or the like when viewed in plan.

In one example, the inner surfaces of the fastening holes 490*e* and 490*g* coming into close contact with the threaded portion 66*b* of the third fastening member 66 may be provided with the contact portion 48*a* having a shape corresponding to the threaded portion 66*b*. That is, as the surface treated layer 48 is removed in a shape corresponding to threads of the threaded portion 66*b* passing through the inner surfaces of the fastening holes 490*e* and 490*gt*, the contact portion 48*a* may be formed into a shape corresponding to the threads. In addition, the contact portion 48*a* may be formed by removing a portion corresponding to the ridges P of the head portion 66*b* from a surface of the first case 49 coming into close contact with the head portion 66*b* of the third fastening member 66.

When the contact portion 48*a* is formed upon fastening of the third fastening member 66 as described above, an additional process of forming the contact portion 48*a* is unnecessary, which may result in improved productivity.

FIG. 13B shows the ridges P formed at an inner surface of the head portion 66*b*. However, the embodiment of the invention is not limited thereto. In another example, as shown by example in FIG. 13C, a washer member 67 having the ridges P may be further provided between the first case 49 and the head portion 66*b* to partially expose a portion of the first case 49 corresponding to the head portion 66*b* of the third fastening member 66. The washer member 67 may have a loop shape or an annular shape to define a fastening hole for passage of the third fastening member 66, and may be provided with the ridges P at a surface thereof coming into contact with the first case 49. The ridges P may have any of various shapes. In one example, the ridges P may have any of various shapes, such as a comb pattern, a circular pattern, a starred pattern or the like when viewed in plan.

Through provision of the washer member 67, pressure may be more effectively applied to the surface treated layer 48 of the first case 49 corresponding to the head portion 66*b*, which may ensure easier formation of the contact portion 48*a*. In addition, a desired shape of washer member 67 may be added and easily used in processing.

Figure 13D:
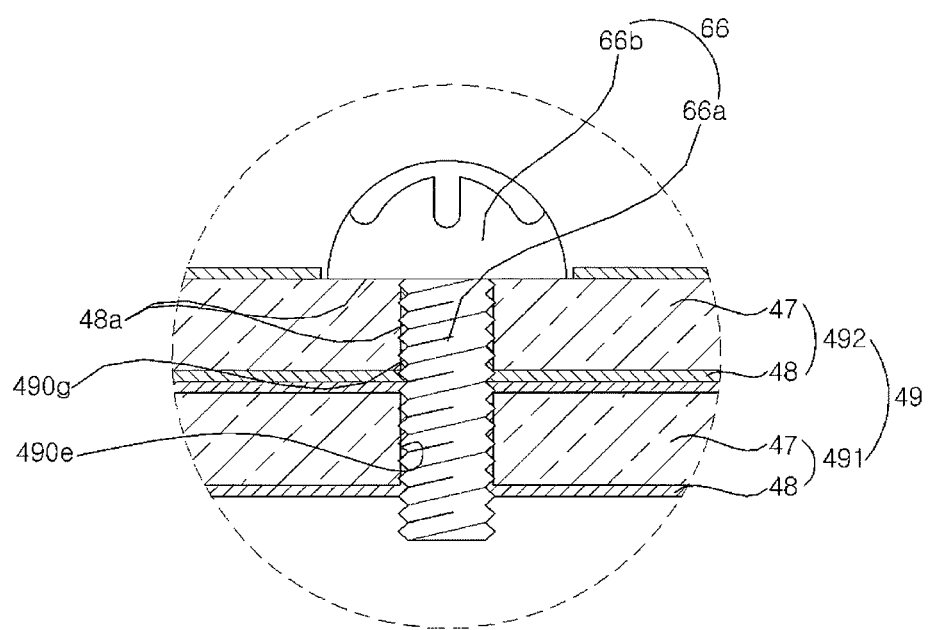

Alternatively, as shown by example in FIG. 13D, the surface treated layer 48 may be removed from part of a portion of the first case 49 coming into contact with the threaded portion 66*a* of the third fastening member 66 to partially form the contact portion 48*a* with respect to the portion corresponding to the threaded portion 66*a* and may be removed from the entire portion of the first case 49 coming into contact with the head portion 66*b* to wholly form the contact portion 48*a* with respect to the portion corresponding to the head portion 66*b*. This serves to improve stability of a ground structure by forming the contact portion 48*a* at a portion corresponding to the head portion 66*b* prior to fastening of the fastening member 66 and to improve productivity by forming the contact portion 48*a* at the inner surfaces of the fastening holes 490*e* and 490*g* upon fastening of the fastening member in consideration of the fact that the fastening holes 490*e* and 490*g* are generally small and have difficulty in removing the surface treated layer 48 therefrom. In another example, the contact portion 48*a* is formed at part of a portion corresponding to the head portion 66*b* and is formed at the entire portion corresponding to the threaded portion 66*a*. Various other alterations are also possible.

Although the embodiment of the invention exemplifies that the first ground structure 72 is formed via connection of the circuit board 37 and the first case part 491, the embodiment of the invention is not limited thereto. Thus, the first ground structure 72 may be formed via connection of the circuit board 37 and the second case part 492. Various other alterations are also possible.

In the integral inverter 30 of the solar cell module 100 having the above described structure, the terminals 31 connected to the ribbons 122 and/or the bypass diodes 33 that provide a bypass path and the inverter member 35 that converts direct current into alternating current are integrated with each other. This integration may result in a simplified installation process and a simplified structure. In addition, as the bypass diodes 33 and the inverter member 35 are connected to each other via the circuit pattern, output cables (i.e. DC output cables) for connection between the bypass diodes 33 and the inverter member 35 may be omitted, which may result in a simplified structure and prevent damage to the solar cell panel 10 caused by the output cables.

On the other hand, in the related art, a junction box and an inverter must be individually manufactured and fixed to a solar cell panel or frame and, thereafter, a positive output cable and a negative output cable of the junction box must be connected to the inverter. In addition, there is an AC output cable of the inverter. This may increase an installation space and installation time and cause damage to or breakdown of the solar cell panel 10 because the three output cables apply shock to the solar cell panel 10 during transportation or when in use.

In the embodiment of the invention, additionally, since the circuit board unit 300 is separable from the first case 49, easy repair and replacement of the circuit board unit 300 is possible, which may enhance repair and replacement efficiency of the integral inverter 30 and minimize replacement costs thereof. In the embodiment of the invention, the first ground structure 72 of the integral inverter 30 is configured using the first case 49 of the integral inverter 30, which may simplify a ground structure while achieving reliability of the circuit board and, in turn, improve stability of the integral inverter 30. In this instance, grounding the first case 49 and the frame 20 by the second ground structure 74 may provide a sufficient ground path to simplify a ground structure. In addition, when the first case 49 includes the first and second case parts 491 and 492 to allow the circuit board unit 300 to be easily located in the first case 49, the first case 49 and the circuit board unit 300 may be grounded by the third ground structure 74, which may further improve electrical stability of the integral inverter 30. This may minimize accidents, such as electrical short, electric shock and the like.

The above described features, configurations, effects, and the like are included in at least one of the embodiments of the invention, and should not be limited to only one embodiment. In addition, the features, configurations, effects, and the like as illustrated in each embodiment may be implemented with regard to other embodiments as they are combined with one another or modified by those skilled in the art. Thus, content related to these combinations and modifications should be construed as including in the scope and spirit of the embodiments of the invention as disclosed in the accompanying claims.

What is claimed is:

1. An integral inverter usable with a solar cell module comprising a solar cell panel, the integral inverter comprising:
   a terminal connected to the solar cell panel;
   a bypass diode electrically connected to the terminal;
   an inverter member including a direct current (DC)-alternating current (AC) inverter electrically connected to the bypass diode; and
   a case configured to integrate at least one of the terminal and the bypass diode with the DC-AC inverter located therein,
   wherein the inverter member includes:
   a current sensor configured to sense whether power in the inverter member is normal; and
   a DC-DC converter configured to convert direct current power transmitted from the bypass diode, the DC-DC converter including at least three interleaving converters, and
   wherein the current sensor and the bypass diode are connected to each other by a circuit pattern on a circuit board.

2. The integral inverter according to claim 1, wherein at least one of the terminal, the bypass diode and the DC-AC inverter are formed on the circuit board or another circuit board so as to be integrated with each other, or surrounded by a potting member so as to be integrated with each other by the potting member.

3. The integral inverter according to claim 1, wherein at least one of the terminal and the bypass diode is located on the circuit board or another circuit board.

4. The integral inverter according to claim 1, wherein the terminal, the bypass diode and the DC-AC inverter are formed on the circuit board or another circuit board and connected to one another.

5. The integral inverter according to claim 1, further comprising a single AC output cable configured to outwardly transmit alternating current converted by the integral inverter.

6. The integral inverter according to claim 1, wherein the case receives the terminal, the bypass diode and the DC-AC inverter therein, and
   wherein the case includes a first through-hole for connection of a solar cell panel and the terminal, and a second through-hole for connection of the DC-AC inverter and an external element.

7. The integral inverter according to claim 6, further comprising an inner member located in the case,
   wherein the circuit board or another circuit board is provided with the terminal, the bypass diode, and the DC-AC inverter, and
   wherein a potting member surrounding the circuit board or the another circuit board, the bypass diode, and the DC-AC inverter are located in the inner member.

8. The integral inverter according to claim 6, wherein the case includes a first case part and a second case part fixed to each other by a fixing member.

9. The integral inverter according to claim 8, wherein the fixing member includes at least one of a bonding member, an elastic member, a latch member and a fastening member.

10. The integral inverter according to claim 6, wherein the second case part includes a first portion and a second portion separated from the first portion.

11. The integral inverter according to claim 1, wherein the case serves as a ground.

12. The integral inverter according to claim 11, further comprising at least one of:
   a first ground structure configured to ground the case and the circuit board or another circuit board;
   a second ground structure configured to ground the case and a frame for fixing of the solar cell panel; and
   a third ground structure configured to ground a first case part of the case and a second case part of the case coupled to the first case part.

13. The integral inverter according to claim 12, wherein at least one of the first to third ground structures is grounded via fastening of a fastening member.

* * * * *